US012609264B2

(12) United States Patent
Wang et al.

(10) Patent No.: US 12,609,264 B2
(45) Date of Patent: Apr. 21, 2026

(54) APPARATUS USING ENHANCED DEFLECTORS TO MANIPULATE CHARGED PARTICLE BEAMS

(71) Applicant: ASML Netherlands B.V., Veldhoven (NL)

(72) Inventors: Yongxin Wang, San Ramon, CA (US); Zhonghua Dong, San Jose, CA (US); Xiaoyu Ji, San Jose, CA (US); Shahedul Hoque, Milpitas, CA (US); Weiming Ren, San Jose, CA (US); Xuedong Liu, San Jose, CA (US); Guofan Ye, South San Francisco, CA (US); Kuo-Chin Chien, San Jose, CA (US)

(73) Assignee: ASML Netherlands B. V., Veldhoven (NL)

( * ) Notice: Subject to any disclaimer, the term of this patent is extended or adjusted under 35 U.S.C. 154(b) by 577 days.

(21) Appl. No.: 17/913,141

(22) PCT Filed: Mar. 18, 2021

(86) PCT No.: PCT/EP2021/056889
§ 371 (c)(1),
(2) Date: Sep. 20, 2022

(87) PCT Pub. No.: WO2021/185938
PCT Pub. Date: Sep. 23, 2021

(65) Prior Publication Data
US 2023/0178328 A1      Jun. 8, 2023

Related U.S. Application Data

(60) Provisional application No. 63/145,691, filed on Feb. 4, 2021, provisional application No. 62/992,870, filed on Mar. 20, 2020.

(51) Int. Cl.
*H01J 37/147* (2006.01)

(52) U.S. Cl.
CPC ... *H01J 37/1474* (2013.01); *H01J 2237/1504* (2013.01)

(58) Field of Classification Search
CPC .. H01J 37/00; H01J 37/02; H01J 37/26; H01J 37/28; H01J 37/1474; H01J 37/023;
(Continued)

(56) References Cited

U.S. PATENT DOCUMENTS

| 5,012,109 A | * | 4/1991 | Shichi | ................... | H01J 37/265 |
| | | | | | 250/307 |
| 2002/0020823 A1 | * | 2/2002 | Chen | ................... | H01J 37/1477 |
| | | | | | 250/492.3 |

(Continued)

FOREIGN PATENT DOCUMENTS

| CN | 103620693 A | 3/2014 |
| EP | 1746630 A1 | 1/2007 |

(Continued)

OTHER PUBLICATIONS

Office Action of the Intellectual Property Office of Taiwan issued in related Taiwanese Patent Application No. 110109924; mailed Oct. 21, 2021 (11 pgs.).

*Primary Examiner* — Jason L McCormack

(74) *Attorney, Agent, or Firm* — FINNEGAN, HENDERSON, FARABOW, GARRETT & DUNNER LLP

(57) ABSTRACT

An apparatus includes a first charged particle beam manipulator positioned in a first layer configured to influence a charged particle beam and a second charged particle beam manipulator positioned in a second layer configured to influence the charged particle beam. The first and second charged particle beam manipulators may each include a plurality of electrodes having a first set of opposing elec-
(Continued)

400

411A
411B
412A
412B
401y
402x
+    +
-    -
410 trodes and a second set of opposing electrodes. A first driver system electrically connected to the first set may be configured to provide a plurality of discrete output states to the first set. A second driver system electrically connected to the second set may be configured to provide a plurality of discrete output states to the second set. The first and second charged-particle beam manipulators may each comprise a plurality of segments; and a controller having circuitry configured to individually control operation of each of the plurality of segments.

20 Claims, 22 Drawing Sheets

(58) Field of Classification Search
CPC .... H01J 37/147; H01J 37/1477; H01J 37/153; H01J 2237/1504
USPC ............................. 250/306, 307, 311, 396 R
See application file for complete search history.

(56) References Cited

U.S. PATENT DOCUMENTS

| | | | | |
|---|---|---|---|---|
| 2006/0131698 | A1* | 6/2006 | Jeong ................... | H01J 37/3177 |
| | | | | 257/620 |
| 2015/0235800 | A1* | 8/2015 | Reed ....................... | H01J 37/22 |
| | | | | 250/311 |
| 2015/0332888 | A1* | 11/2015 | Reed ....................... | H01J 37/22 |
| | | | | 250/311 |
| 2015/0357155 | A1* | 12/2015 | Dohi ..................... | H01J 37/153 |
| | | | | 250/307 |
| 2019/0341222 | A1* | 11/2019 | Hu .......................... | H01J 37/14 |

FOREIGN PATENT DOCUMENTS

| | | | |
|---|---|---|---|
| EP | 2702595 | A1 | 3/2014 |
| TW | I441229 | B | 6/2014 |
| TW | 201503205 | A | 1/2015 |
| TW | I546840 | B | 8/2016 |
| WO | WO 2014/100835 | A1 | 6/2014 |

* cited by examiner

<u>1</u>

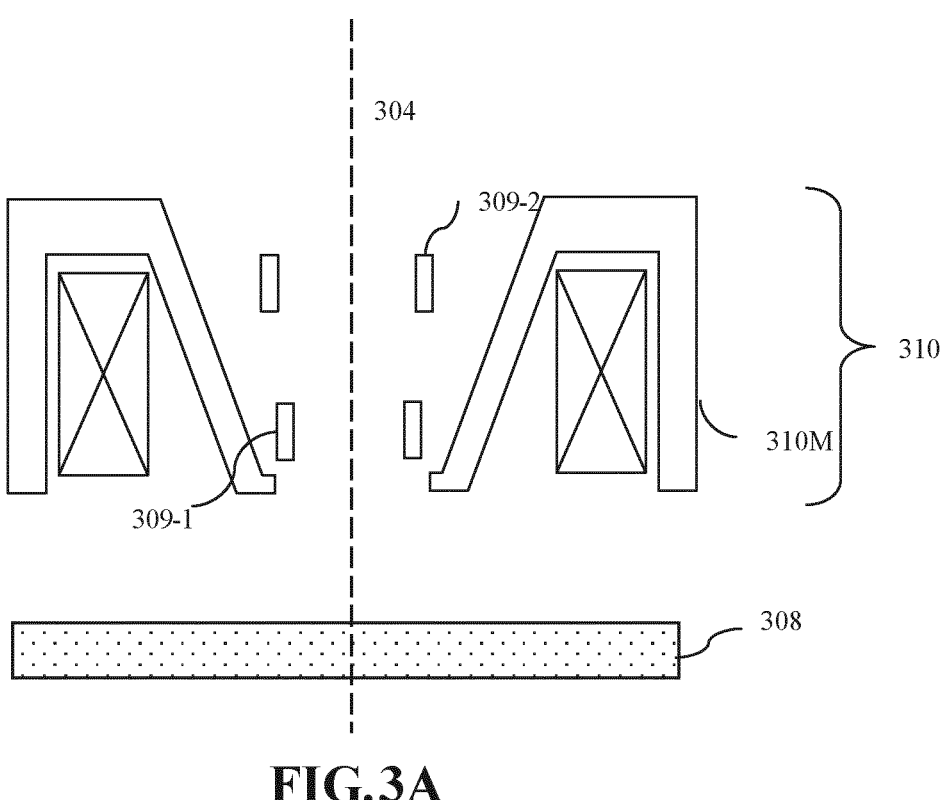
FIG.3A
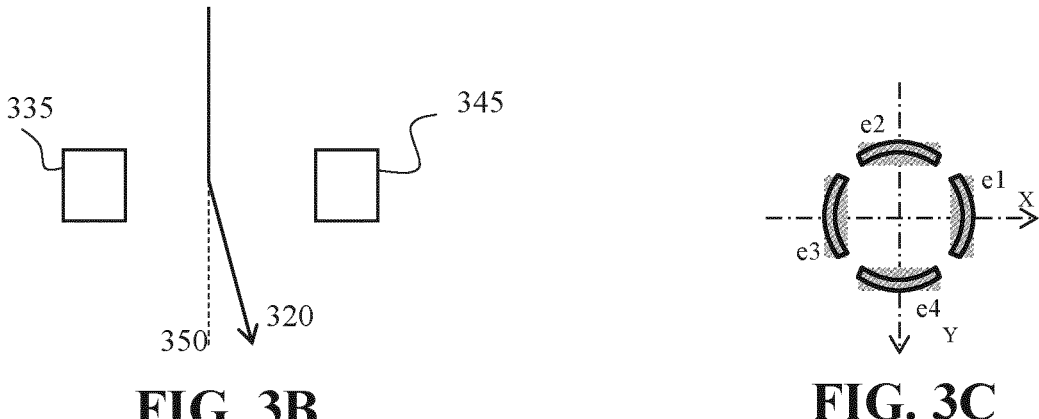
FIG. 3B                    FIG. 3C

400

550

600

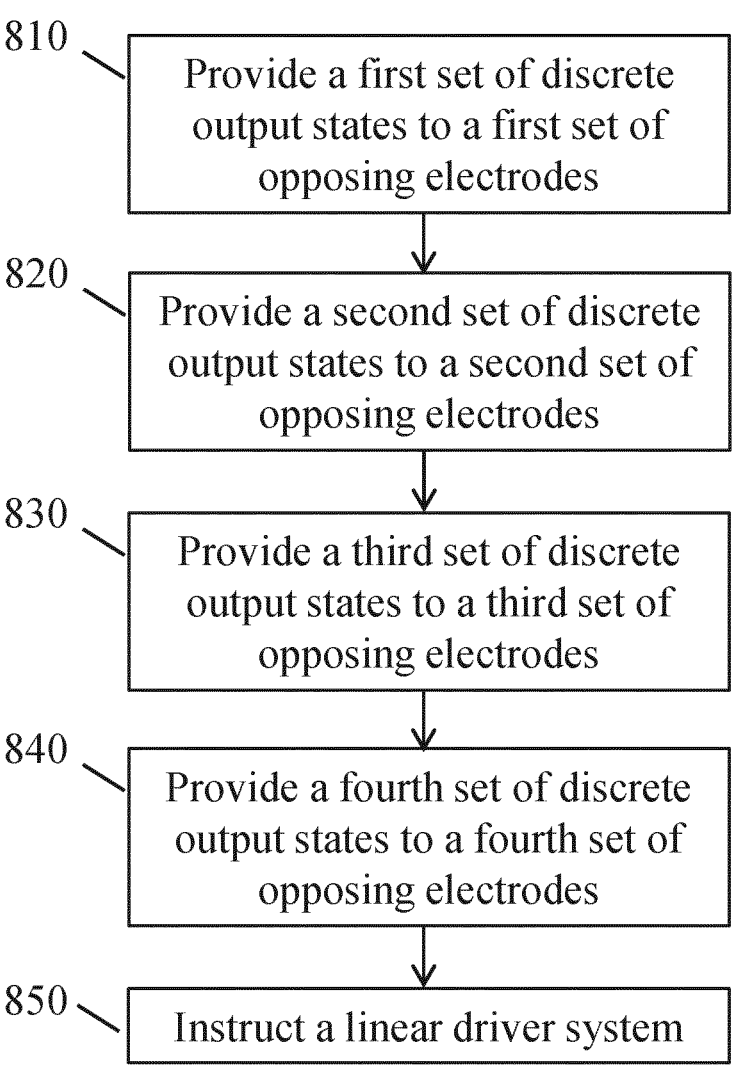

800

810 — Provide a first set of discrete output states to a first set of opposing electrodes 820 — Provide a second set of discrete output states to a second set of opposing electrodes 830 — Provide a third set of discrete output states to a third set of opposing electrodes 840 — Provide a fourth set of discrete output states to a fourth set of opposing electrodes 850 — Instruct a linear driver system

Deflecting a charged-particle beam using a first deflector      1010

Deflecting a charged-particle beam using a second deflector      1020

Individually controlling operation of each segment of the first and the second deflectors      1030

1100

Deflecting a charged-particle beam using a first deflector ⌇1110

Deflecting a charged-particle beam using a second deflector ⌇1120

Individually controlling, using a first and a second driver system, an electrostatic and a magnetic deflector of each of the first and the second deflectors ⌇1130

APPARATUS USING ENHANCED DEFLECTORS TO MANIPULATE CHARGED PARTICLE BEAMS

CROSS-REFERENCE TO RELATED APPLICATIONS

This application claims priority to International Application No. PCT/EP2021/056889, filed Mar. 18, 2021, and published as WO 2021/185938 A1, which claims priority of U.S. application 62/992,870 which was filed on Mar. 20, 2020, and U.S. application 63/145,691, which was filed on Feb. 4, 2021. The contents of these applications are incorporated herein by reference in their entireties.

TECHNICAL FIELD

The embodiments provided herein generally relate to an inspection apparatus, and more particularly, to a charged particle beam manipulation system of an inspection apparatus.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, defect detection accuracy in yield control become more important. Although multiple electron beams may be used to increase the throughput, the limitation in electron beam deflection may limit the imaging throughput desired for reliable defect detection and analysis rendering the inspection tools inadequate for their desired throughput.

As the devices continue to shrink and the IC chips get increasingly more complex in architecture, inspection and metrology systems have made significant advancements such as multi-beam inspection, multiple detectors, etc. to increase wafer inspection throughput, among other things. Charged-particle probe beams with low landing energy provide surface-related information while the probe beams with high landing energy may be used to extract information from buried layers. To obtain a high overall wafer inspection throughput, it may be desirable to increase the field-of-view of scanning for both, low landing energy and high landing energy modes. Achieving a large field-of-view at high landing energy may include optimization of the scanning deflection system and the associated electronic circuit design. Although existing systems may achieve high throughputs for low landing energy inspections, they have difficulty obtaining high throughput while maintaining the image quality.

SUMMARY

Some embodiments of the present disclosure may provide a single or multi-beam inspection apparatus, and more particularly, a single or multi-beam inspection apparatus including a scanning deflection system. In some embodiments, an apparatus including a first charged particle beam manipulator comprising a plurality of layers is provided. The manipulator may be configured to influence a charged particle beam. The charged particle beam may be an electron beam. The apparatus further includes a plurality of electrodes having a first set of opposing electrodes and a second set of opposing electrodes, a first driver system electrically connected to the first set of opposing electrodes and configured to provide a plurality of discrete output states to the first set of opposing electrodes, and a second driver system electrically connected to the second set of opposing electrodes and configured to provide a plurality of discrete output states to the second set of opposing electrodes. Furthermore, each of the plurality of layers may comprise the plurality of electrodes, the first driver system, and the second driver system.

In some embodiments, a method for dynamically deflecting an electron beam is provided. The method includes using a first driver system to control a first set of opposing electrodes so as to influence an electron beam and using a second driver system to control a second set of opposing electrodes so as to influence the electron beam, wherein the first driver system, the first set of opposing electrodes, the second driver system, and the second set of opposing electrodes are implemented in a first layer.

In some embodiments, a non-transitory computer readable medium including a set of instructions that is executable by one or more processors of a controller to cause the controller to perform a method for dynamically deflecting an electron beam is provided. The method includes instructing a first driver system, connected to a first set of opposing electrodes, to control a first set of output states to influence an electron beam and instructing a second driver system, connected to a second set of opposing electrodes, to control a second set of output states to influence the electron beam, wherein the first driver system, the first set of opposing electrodes, the second driver system and the second set of opposing electrodes may be implemented in a first layer.

Some aspects of the present disclosure are directed to a charged-particle beam apparatus comprising a first charged-particle beam deflector configured to influence a primary charged-particle beam generated by a charged-particle source along a primary optical axis; a second charged-particle beam deflector positioned downstream from the first charged-particle beam deflector and configured to influence the primary charged-particle beam, wherein the first and the second charged-particle beam deflectors each comprise a plurality of segments; and a controller having circuitry configured to individually control operation of each segment of the plurality of segments.

Some aspects of the present disclosure are directed to a charged-particle beam apparatus comprising a first charged-particle beam deflector configured to influence a primary charged-particle beam generated by a charged-particle source along a primary optical axis; a second charged-particle beam deflector positioned downstream from the first charged-particle beam deflector and configured to influence the primary charged-particle beam, wherein the first and the second charged-particle beam deflectors each comprise an electrostatic deflector electrically connected to a first driver system configured to enable the electrostatic deflector to deflect the primary charged-particle beam; and a magnetic deflector electrically connected to a second driver system configured to enable the magnetic deflector to deflect the primary charged-particle beam.

Some aspects of the present disclosure are directed to a method for deflecting a primary charged-particle beam passing through a deflection scanning unit of a charged-particle beam apparatus. The method may comprise deflecting, using a first charged-particle beam deflector, the primary charged-particle beam generated by a charged-particle source along a primary optical axis; deflecting, using a second charged-particle beam deflector positioned downstream from the first charged-particle beam deflector, the primary charged-particle beam, wherein the first and the second charged-particle beam deflectors each comprise a plurality of segments; and individually controlling operation, using a controller having circuitry, of each segment of the plurality of segments.

Some aspects of the present disclosure are directed to a method for deflecting a primary charged-particle beam passing through a deflection scanning unit of a charged-particle beam apparatus. The method may comprise deflecting, using a first charged-particle beam deflector, the primary charged-particle beam generated by a charged-particle source along a primary optical axis; deflecting, using a second charged-particle beam deflector positioned downstream from the first charged-particle beam deflector, the primary charged-particle beam, wherein the first and the second charged-particle beam deflectors each comprise: an electrostatic deflector electrically connected to a first driver system configured to enable the electrostatic deflector to influence the primary charged-particle beam; and a magnetic deflector electrically connected to a second driver system configured to enable the magnetic deflector to influence the primary charged-particle beam.

Some aspects of the present disclosure are directed to a non-transitory computer readable medium storing a set of instructions that is executable by one or more processors of a charged-particle beam apparatus to cause the charged-particle beam apparatus to perform a method of deflecting a primary charged-particle beam passing through a deflection scanning unit of the charged-particle beam apparatus. The method may comprise deflecting, using a first charged-particle beam deflector, the primary charged-particle beam generated by a charged-particle source along a primary optical axis; deflecting, using a second charged-particle beam deflector positioned downstream from the first charged-particle beam deflector, the primary charged-particle beam, wherein the first and the second charged-particle beam deflectors each comprise a plurality of segments; and individually controlling operation of each segment of the plurality of segments configured to deflect the primary charged-particle beam.

Some aspects of the present disclosure are directed to a non-transitory computer readable medium storing a set of instructions that is executable by one or more processors of a charged-particle beam apparatus to cause the charged-particle beam apparatus to perform a method of deflecting a primary charged-particle beam passing through a deflection scanning unit of the charged-particle beam apparatus. The method may comprise deflecting, using a first charged-particle beam deflector, the primary charged-particle beam generated by a charged-particle source along a primary optical axis; deflecting, using a second charged-particle beam deflector positioned downstream from the first charged-particle beam deflector, the primary charged-particle beam, wherein the first and the second charged-particle beam deflectors each comprise: an electrostatic deflector electrically connected to a first driver system configured to enable the electrostatic deflector to influence the primary charged-particle beam; and a magnetic deflector electrically connected to a second driver system configured to enable the magnetic deflector to influence the primary charged-particle beam.

Other advantages of the embodiments of the present disclosure will become apparent from the following description taken in conjunction with the accompanying drawings wherein are set forth, by way of illustration and example, certain embodiments of the present invention.

BRIEF DESCRIPTION OF FIGURES

FIG. 3A is a diagram illustrating a configuration of a scanning deflection system, consistent with embodiments of the present disclosure.

FIG. 3B is a diagrammatic representation of deflection of a charged particle beam, consistent with embodiments of the present disclosure.

FIG. 3C is a diagram illustrating a configuration of exemplary deflection elements, consistent with embodiments of the present disclosure.

FIG. 6 is a flow chart illustrating an exemplary method for controlling drivers associated with deflection systems, consistent with embodiments of the present disclosure.

DETAILED DESCRIPTION

Figure 1:
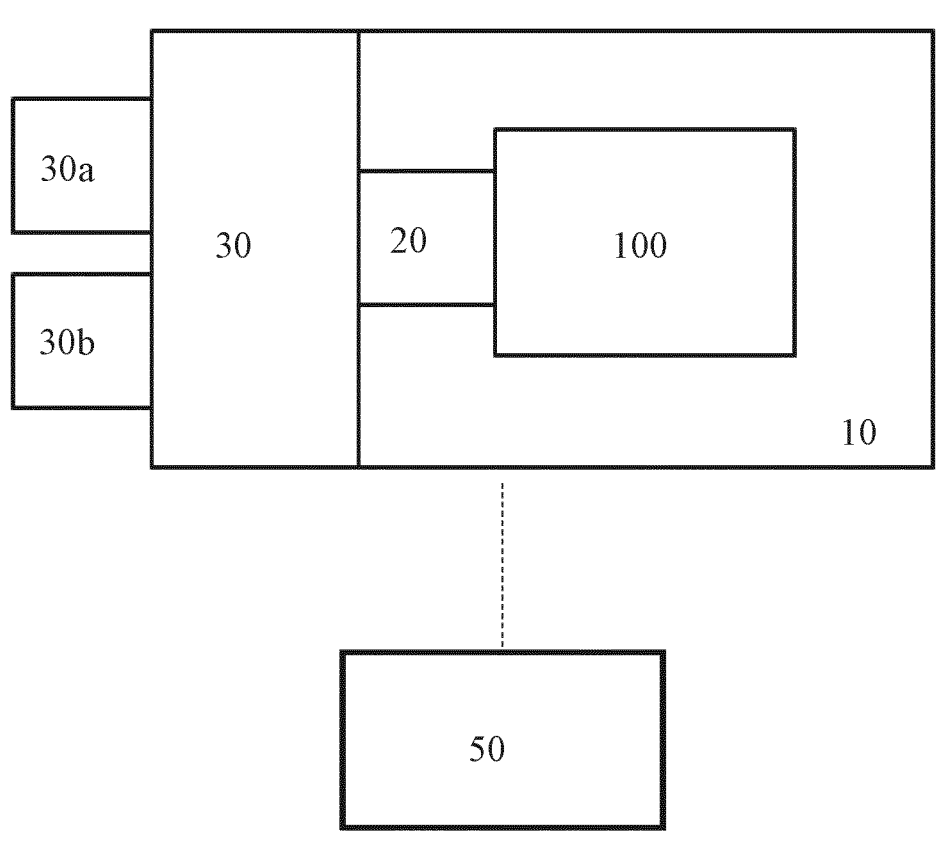
FIG. 1 is a diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Although a charged particle beam imaging system, such as a single-beam SEM or a multi-beam SEM, may be useful in yield improvements, achieving the higher throughput that needs to be achieved may lead to a higher complexity and higher power consumption in a high speed scanning deflection system. The disclosed deflection structure can be configured to enable a beam to scan a large surface of a sample at high speed with low distortions. The SEM uses the deflection structure to direct the beam for scanning the surface to build up the image of the sample. The deflection structure requires a deflection driver generating a variety of voltages within a predefined range to generate electromagnetic fields to enable the beam to be manipulated.

To make a scanning deflection system, conventional systems utilize a well-designed and constructed linear amplifier and a digital-to-analog converter (DAC) or a continuous time saw tooth signal generator. But the use of conventional deflection driver components is not preferable as they can cause issues. For example, conventional deflection driver components are more complex, resulting in reliability issues, increased noise levels under various scenarios, and increased consumption of power, which can stress the SEM.

Some embodiments of the disclosure may involve an electron beam scanning deflection system. The scanning deflection system may be for dynamic deflection. In some embodiments of the present disclosure, a charged particle beam inspection system includes an improved deflection structure with a driver system configured to manipulate the beam. Instead of an analog amplifier and a DAC or continuous time saw tooth signal generator as may be needed by the conventional art, a driver system may use a plurality of high voltage supplies, or high speed and high voltage switches for manipulating the beam. High voltage power supplies may provide static high voltage outputs with predefined values. High speed and high voltage switches may provide the needed high voltage(s) to be provided to the deflectors (electrodes).

For example, high speed and high voltage switches may replace the high voltage linear amplifier and the digital-to-analog converter (DAC) or the continuous time saw tooth signal generator. The replacement may simplify the circuit design of the driver system because less elements are required to build a switch compared to a high voltage linear amplifier. Moreover, the digital-to-analog converter or the continuous time saw tooth signal generator may no longer be needed because configurations, transmitted from a controller of the charged particle beam inspection system in the form of digital signals, can be directly applied to the switch connected to the high voltage regulators, which supply static high voltage outputs.

In some embodiments, a deflection structure and driver system may provide several advantages by operating an active device in switch mode rather than linear mode, wherein the active device may control and provide power to the deflection structure. A trade off relationship between linearity, speed, and power consumption (as with conventional scanning deflection systems) may be reduced or avoided. First, the deflection structure can more quickly adjust voltages provided by power supplies because, using the same components or process, the building of high speed and high voltage switches may be easier than that of high voltage and high speed linear amplifiers, and the switches can reach higher speed. This may enable a faster manipulation of the beam. Second, the scanning deflection system may also provide a more accurate control input signal (e.g., linearity) since the switch mode active device in the driver system may provide desired voltages to the deflection structure even under high speed. Third, the scanning deflection system may use less power. Thus, there may be less energy waste. An active device in switch mode consumes less power compared to an active device in linear mode by turning the high speed high voltage switches on or off. Thus, the switch mode active device eases the thermal management of the charged particle beam inspection system. And fourth, by using less components, the disclosed driver system may improve the overall reliability of the charged particle beam inspection system. The circuitry of the driver system is simplified, thus improving the overall reliability of the SEM.

The limits of electron beam inspection and metrology systems in a wafer processing fab are being constantly pushed to support the advancements in chip design and device design. With complex 3D structures being employed in devices such as 3D NANDs, FinFETs, DRAMs, defects may be buried deeper within the substrate, and secondary electrons microscopy providing surface-level information may be inadequate and often misleading. Electron beams with high landing energy may penetrate the sub-surface layers and provide more information about defects and structures buried deeper within the substrate. However, some of the issues encountered in using high landing energy beams include generating backscattered electrons with a low detection and sampling yield, smaller field-of-views (FOVs) compared to low landing energy electron beams, poor image quality, and low throughput. In addition, high landing energy beam systems may also encounter challenges in driver circuit design due to prohibitively high voltages required for beam deflection to maintain the FOV as the landing energy in increased. Therefore it may be desirable to provide systems and methods for obtaining large FOVs for low and high landing energy while maintaining high image quality for defect inspection and overlay metrology, and high output.

Some embodiments of the present disclosure are directed to apparatuses and methods of deflecting a primary electron beam using segmented deflectors. The method may include deflecting the primary electron beam with two or more deflectors, each deflector comprising a plurality of segments. Each of the plurality of segments may comprise a multi-pole structure including a plurality of electrodes configured to deflect the primary electron beam. Each segment may be electronically driven using a dedicated driver system or driver circuitry capable of supporting the scan frequency and driver linearity to adequately deflect the beam to form a large FOV.

Other objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the present disclosure, some embodiments may be described in the context of providing scanning deflection systems and scanning deflection methods in systems utilizing electron beams ("e-beams"). Some scanning deflection systems may use electric fields to influence a charged particle beam. However, the disclosure is not so limited. Other types of charged particle beams may be similarly applied. For example, systems and methods may be applicable with optics, photons, x-rays, and ions, etc. Deflection may be used to scan a beam over a surface in, for example, cathode ray tubes (CRTs), lithography machines, scanning electron microscopes (SEMs), or other analytical instruments. While some embodiments are discussed with reference to deflection systems that use electric field to influence a beam, deflection may also be achieved with magnetic fields, for example.

Reference is now made to FIG. 1, which is a diagram illustrating an exemplary charged particle beam inspection system 1, consistent with embodiments of the present disclosure. As shown in FIG. 1, charged particle beam inspection system 1 includes a main chamber 10, a load/lock chamber 20, an electron beam tool 100, and an equipment front end module (EFEM) 30. Electron beam tool 100 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load/lock chamber 20.

Load/lock chamber 20 may be connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 100. In some embodiments, electron beam tool 100 may comprise a single-beam inspection tool. In other embodiments, electron beam tool 100 may comprise a multi-beam inspection tool.

A controller 50 is electronically connected to electron beam tool 100. Controller 50 may be a computer configured to execute various controls of charged particle beam inspection system 1. Controller 50 may also include a processing circuitry configured to execute various signal and image processing functions. While controller 50 is shown in FIG. 1 as being outside of the structure that includes main chamber 10, load/lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
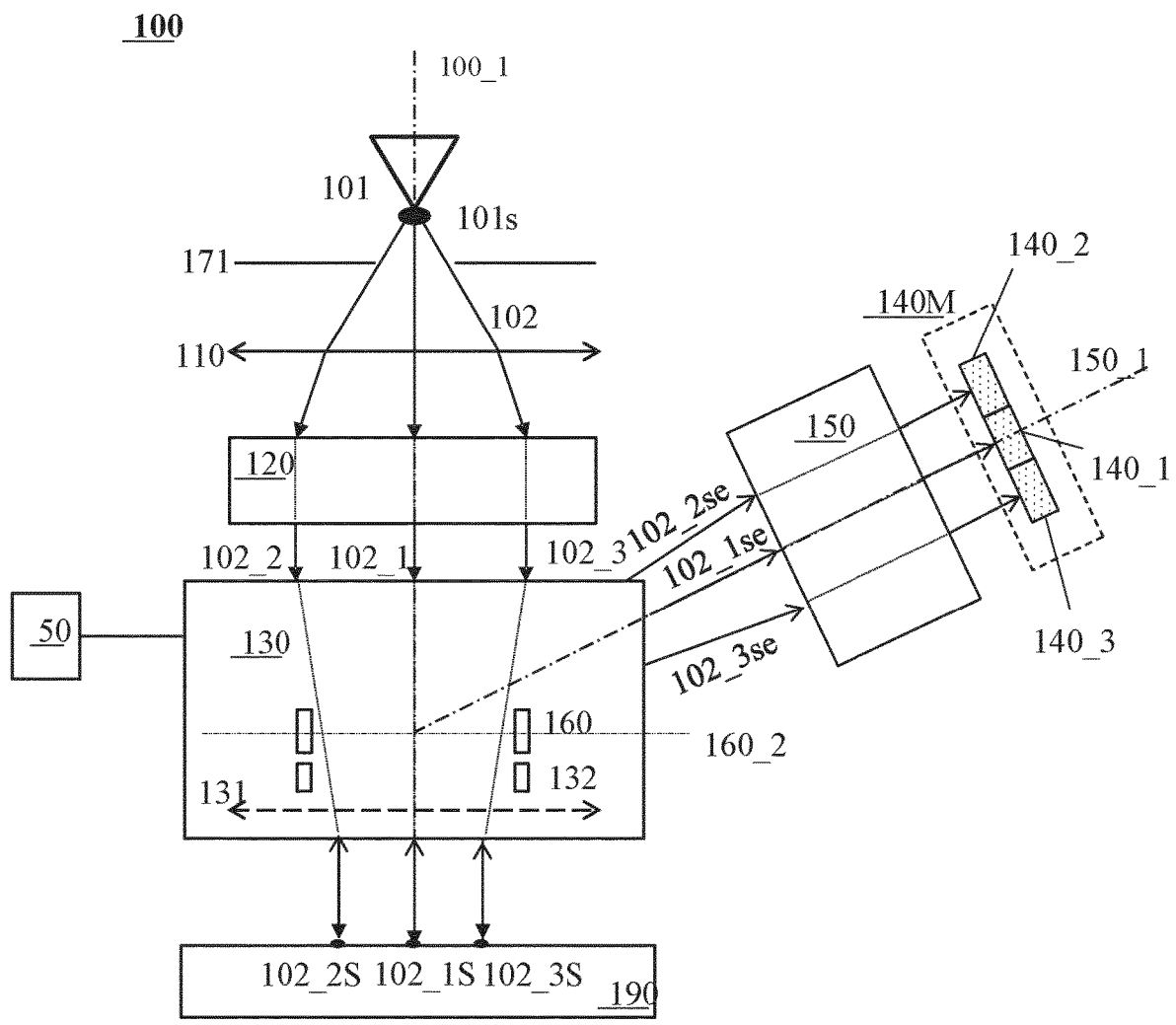
FIG. 2 is a diagram illustrating an exemplary multi-beam apparatus that is part of the exemplary electron beam inspection system of FIG. 1, consistent with embodiments of the present disclosure.

Reference is now made to FIG. 2, which illustrates a diagram illustrating an exemplary electron beam tool 100 including a multi-beam inspection tool that is part of the exemplary charged particle beam inspection system 1 of FIG. 1, consistent with embodiments of the present disclosure. An electron beam tool 100 (also referred to herein as apparatus 100) comprises an electron source 101, a gun aperture plate 171, a condenser lens 110, a source conversion unit 120, a primary projection optical system 130, a sample stage (not shown in FIG. 2), a secondary optical system 150, and an electron detection device 140M. Primary projection optical system 130 can comprise an objective lens 131. Electron detection device 140M can comprise a plurality of detection elements 140_1, 140_2, and 140_3. Beam separator 160 and deflection scanning unit 132 can be placed inside primary projection optical system 130.

Electron source 101, gun aperture plate 171, condenser lens 110, source conversion unit 120, beam separator 160, deflection scanning unit 132, and primary projection optical system 130 may be aligned with a primary optical axis 100_1 of apparatus 100. Secondary optical system 150 and electron detection device 140M can be aligned with a secondary optical axis 150_1 of apparatus 100.

Electron source 101 can comprise a cathode (not shown) and an extractor or anode (not shown), in which, during operation, electron source 101 is configured to emit primary electrons from the cathode and the primary electrons are extracted or accelerated by the extractor and/or die anode to form a primary electron beam 102 that form a primary beam crossover (virtual or real) 101s. Primary electron beam 102 can be visualized as being emitted from crossover 101s.

Source conversion unit 120 can comprise an image-forming element array (not shown in FIG. 2), a field curvature compensator array (not shown in FIG. 2), an astigmatism compensator array (not shown in FIG. 2), and a beam-limit aperture array (not shown in FIG. 2). The image-forming element array can comprise a plurality of micro-deflectors or micro-lenses to form a plurality of parallel images (virtual or real) of crossover 101s with a plurality of electron beams (e.g., beamlets) of primary electron beam 102. The field curvature compensator array may comprise a plurality of micro-lenses to compensate field curvature aberrations of the primary electron beams The astigmatism compensator array may comprise a plurality of micro-stigmators to compensate astigmatism aberrations of the primary electron beam. The beam-limit aperture array can limit the plurality of electron beam. FIG. 2 shows three electron beams 102_1, 102_2, and 102_3 as an example, and it is appreciated that the source conversion unit 120 can be configured to form any number of electron beams.

Controller 50 can be connected to various parts of charged particle beam inspection system 1 of FIG. 1, such as source conversion unit 120, electron detection device 140M, or primary projection optical system 130. More particularly, controller 50 may be connected to deflection scanning unit 132. In some embodiments, as explained in further details below, controller 50 can perform various processing functions. Controller 50 can also generate various control signals to govern operations of the charged particle beam inspection system.

Condenser lens 110 can focus primary electron beam 102. The electric currents of electron beams 102_1, 102_2, and 102_3 downstream of source conversion unit 120 can be varied by adjusting the focusing power of condenser lens 110 or by changing the radial sizes of the corresponding beam-limit apertures within the beam-limit aperture array. Objective lens 131 can focus electron beams 102_1, 102_2, and 102_3 onto a sample 190 for inspection and can form probe spots 102_1s, 102_2s, and 102_3s on surface of sample 190. Gun aperture plate 171 can block off peripheral electrons of primary electron beam 102 not in use to reduce Coulomb effect. The Coulomb effect can enlarge the size of each of probe spots 102_1s, 102_2s, and 102_3s, and therefore deteriorate inspection resolution.

Beam separator 160 can be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of electron beams 102_1, 102_2, and 102_3 is equal in magnitude and opposite in direction to the force exerted on the electron by magnetic dipole field B1. Electron beams 102_1, 102_2, and 102_3 can therefore pass straight through beam separator 160 with zero deflection angles.

Deflection scanning unit 132 can deflect electron beams 102_1, 102_2, and 102_3 to scan probe spots 102_1s, 102_2s, and 102_3s over scanned areas in a section of the surface of sample 190. In response to incidence of electron beams 102_1, 102_2, and 102_3 at probe spots 102_1s, 102_2s, and 102_3s, secondary electron beams 102_1se, 102_2se, and 102_3se can be emitted from sample 190. Each of secondary electron beams 102_1se, 102_2se, and 102_3se can comprise electrons with a distribution of energies including secondary electrons and backscattered electrons. Beam separator 160 can direct secondary electron beams 102_1se, 102_2se, and 102_3se towards secondary optical system 150. Secondary optical system 150 can focus secondary electron beams 102_1se, 102_2se, and 102_3se onto detection elements 140_1, 140_2, and 140_3 of electron detection device 140M. Detection elements 140_1, 140_2, and 140_3 can detect corresponding secondary electron beams 102_1se, 102_2se, and 102_3se and generate corresponding signals used to reconstruct images of the corresponding scanned areas of sample 190.

In some embodiments, a scanning deflection system may be applied to a deflection scanning unit of a single or multi-beam charged particle beam system. For example, deflection scanning unit 132 (see FIG. 2) may include an electron beam scanning deflection system.

Reference is now made to FIG. 3A, which illustrates configuration of deflectors and objective lens assembly, consistent with embodiments of the present disclosure. As shown in FIG. 3A, a magnetic objective lens assembly 310 and deflectors 309-1 and 309-2 may be disposed within the magnetic field of objective lens assembly 310, wherein deflectors 309-1 and 309-2 may be implemented in a deflection scanning unit (e.g., deflection scanning unit 132 of FIG. 2). Deflectors 309-1 and 309-2 may be configured to dynamically deflect an electron beam to scan a desired area on the surface of a sample 308. The dynamic deflection of an electron beam may cause a desired area or a desired region of interest to be scanned iteratively, for example in a raster scan pattern, to generate secondary electron beams (e.g., 102_1se, 102_2se, and 102_3se of FIG. 2) for sample inspection. Deflectors 309-1 or 309-2 can be configured to deflect an electron beam in X-axis or Y-axis directions. As used herein, X-axis and Y-axis form Cartesian coordinates of an arbitrary reference frame, where the electron beam may propagate along a Z-axis or primary optical axis 304. The X-axis refers to the horizontal axis or the lateral axis extending along the width of the paper, and the Y-axis refers to the vertical axis extending in-and-out of the plane of the paper in the view of FIG. 2 or FIG. 3A.

Reference is now made to FIG. 3B, which shows a representation of a charged particle beam passing through a deflector, consistent with embodiments of the present disclosure. In some embodiments, a charged particle beam may be deflected as it passes through a region between a pair of electrodes. As shown in FIG. 3B, a charged particle beam 320 may travel along an axis 350. Axis 350 may align with the Z-axis of a charged particle beam system. An electrode 335 and an electrode 345 may be disposed on either side of axis 350. Voltage may be applied to electrodes 335 and 345. Electric field may be formed between the electrodes, the components of the electric field being substantially perpendicular to the direction of travel of charged particle beam 320. As charged particle beam 320 travels through the resulting electric field, it may be influenced by the electric field. For example, its trajectory may be altered. A deflection scanning unit may use deflectors to deflect a beam so as to scan the beam across a region on a sample.

Reference is now made to FIG. 3C, which is a diagram illustrating a configuration of electrodes, consistent with embodiments of the present disclosure. FIG. 3C shows a multi-pole structure with four electrodes e1-e4 that can be configured to function in different ways based on the voltages applied to each of the electrodes. A deflector may be formed using electrodes e1-e4. In some embodiments, a deflection voltage may be formed between opposing pairs of electrodes (e.g., the pair formed by electrodes e2 and e4; or the pair formed by electrodes e1 and e3). Multiple pairs of electrodes may be combined so that deflection in a two-dimensional plane is possible. A deflector may be located in the region of an objective lens in a SEM system. The deflector may be used to dynamically direct a beam to a desired location on a sample surface. In some embodiments, there may be multiple beams that may be directed to multiple locations on the sample surface.

In some embodiments, deflectors may be used for other functions. In some cases, for example in the case of a micro-lens or micro-stigmator, static driving voltages may be normally applied to deflectors. Such deflectors may also be operated dynamically at high speed, for example when quickly switching between different operating conditions. Accordingly, it may be useful to apply aspects of the present disclosure, such as deflector and driver designs, to such deflectors. In one situation, when one voltage is applied to all electrodes, a multi-pole structure may be configured to function as a micro-lens. When two voltages of the same absolute value but opposite directions are applied to the two pairs of opposite electrodes, the multi-pole structure may be configured to function as a micro-stigmator. For example, in FIG. 3C, when V1 is applied to electrodes e1 and e3, and when –V1 is applied to electrodes e2 and e4, the multi-pole structure functions as a micro-stigmator. And when a zero voltage is applied to one pair of opposite electrodes, and two voltages of the same absolute value but opposite polarity are applied to the other pair of opposite electrodes, the multi-pole structure may be configured to function as a micro-deflector. For example, in FIG. 3C, when 0V is applied to e2 and e4, V2 is applied to e1, and –V2 is applied to e3, the multi-pole structure functions as a micro-deflector. When operating as a micro-deflector, as V2 increases, the angle of deflection of the electron beam increases as well. In some cases, a micro-deflector may be configured to operate with two-dimensional deflection functions, or more. FIG. 3C shows four electrodes configured in multi-pole structure as an example, and it is appreciated that multi-pole structures can be configured to form more than four electrodes.

Figure 4A:
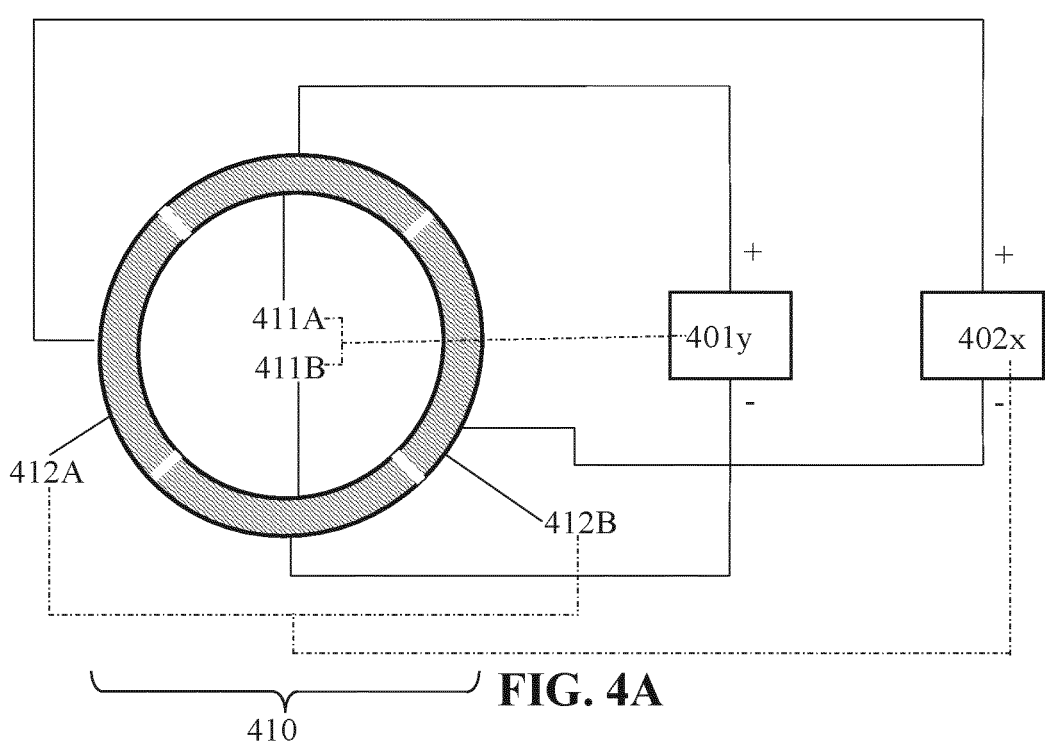
FIG. 4A is a diagram illustrating a plan view of an illustrative embodiment of a deflection system that may be implemented in a deflection scanning unit in a single or multi-beam inspection system, consistent with embodiments of the present disclosure.

Reference is now made to FIG. 4A, which shows a plan view of an illustrative embodiment of a deflection structure 400 implemented in an electron beam inspection system, consistent with embodiments of the present disclosure. The electron beam inspection system may include a single beam or a multi-beam system. In some embodiments, deflection structure 400 can be one of several deflection structures to be implemented in a scanning deflection system (e.g., deflection scanning unit 132 of FIG. 2) of an electron beam inspection system. Deflection structure 400 can be used to manipulate an electron beam.

A deflection system may include a deflection structure and driver system. A deflection structure may include a multi-pole structure. As shown in FIG. 4A, deflection structure 400 includes a multi-pole structure 410, a first driver system 401y, and a second driver system 402x. The multi-pole structure 410 includes a first set of opposing electrodes 411A-B and a second set of opposing electrodes 412A-B that can be configured to deflect the electron beam in each deflection direction (such as the x-direction or y-direction) based on output states applied to each set. The output states may correspond to voltages applied to the electrodes. The multi-pole structure 410, comprising sets of electrodes 411A-B and 412A-B, can function as a dynamic deflector (e.g., it may perform the functions of deflector 309-1 or 309-2 in FIG. 3A) based on the voltages applied to the electrodes 411A-B and 412A-B. For example, when first driver system 401y applies 0V to electrodes 411A and 411B, second driver system 402x applies V1 to electrode 412A and –V1 to electrode 412B, the electron beam is deflected in a x-direction. By way of further example, when first driver system 401y applies V2 to electrode 411A and –V2 to electrode 411B, and second driver system 402x applies 0V to electrodes 412A and 412B, the electron beam is deflected in a y-direction. When V1 and V2 increase, the angles of deflection of the electron beam increases as well. FIG. 4A shows four electrodes configured in multi-pole structure 410 as an example, and it is appreciated that multi-pole structure 410 can be configured to form more than four electrodes. Moreover, FIG. 4A shows two sets of opposing electrodes 411A-B and 412A-B configured in multi-pole structure 410 as an example, and it is appreciated that multi-pole structure 410 can be configured to form any number of sets of opposing electrodes (including one).

In some embodiments, sets of electrodes 411A-B and 412A-B can be formed in a substrate and include multiple beam manipulators in the substrate. For example, each beam manipulator can be electrically isolated from other beam manipulators by a circular trench filled with isolating material (e.g., such as CVD oxide). Within the circular area, the manipulator can be formed, for example, by etching a deflector hole and any isolating trenches between the electrodes and by sputtering a metal layer over the places where electrodes should be formed. The metal layers may form sets of electrodes 411A-B and 412A-B and some of the layers can be used for a first set of electrodes and other layers can be used for a second set of electrodes.

First driver system 401y is electrically connected to the first set of opposing electrodes 411A-B and configured to provide a plurality of discrete output states to the first set of opposing electrodes 411A-B, and second driver system 402x is electrically connected to the second set of opposing electrodes 412A-B and configured to provide a plurality of discrete output states to the second set of opposing electrodes 412A-B. As discussed above with respect to the multi-pole structure 410, each of the driver systems 401y and 402x is configured to enable a set of opposing electrodes (such as 411A-B and 412A-B) to deflect the electron beam in a direction by providing a plurality of discrete output states to the corresponding set of opposing electrodes. Each of the driver systems 401y and 402x may include a plurality of power supplies and a plurality of switches. The switches may refer to active devices operating in switch mode.

A power supply may be configured to provide a plurality of discrete output states. Or, each of a plurality of power supplies can be configured to provide a discrete output state. For example, driver 401y can be configured with a power supply that provides −100V, 0V, and +100V. By way of further example, driver 401y can be configured with a power supply that provides −100V, −50V, 0V, +50V, and +100V.

The plurality of switches can be configured by a controller and transmit the incoming discrete output state from a power supply to the corresponding set of opposing electrodes. A controller (e.g., controller 50 in FIG. 1) may transmit digital signals to apply the digital signals to turn on or off switches to transmit the incoming discrete output state or block the output state. For example, three switches may connect three tap points associated with a power supply and a first set of opposing electrodes, and a controller may transmit digital signals to select one of the three switches to transmit a desired output state from the power supply corresponding to the selected switch. The plurality of switches can be MOS drivers enabling a fast transition of output states.

Figure 5A:
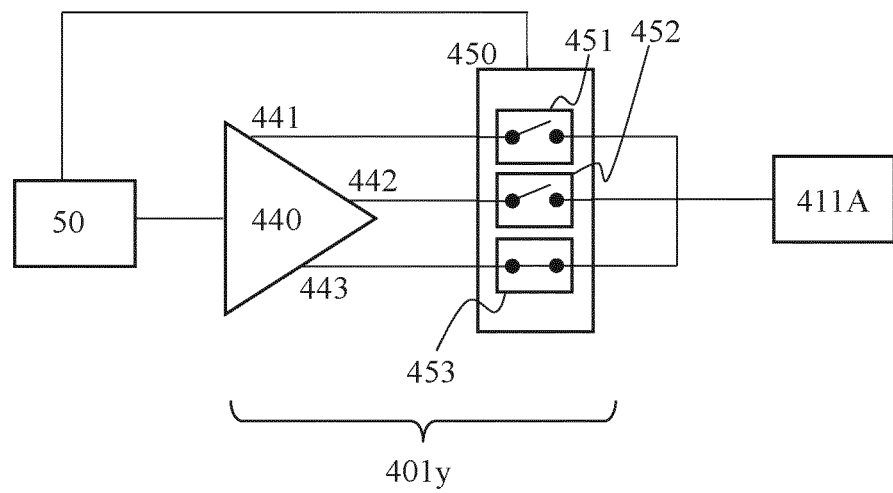
FIG. 5A is a diagram illustrating a driver, consistent with embodiments of the present disclosure.

Reference is now made to FIG. 5A, which shows a diagrammatic representation of a driver (such as driver system 401y), consistent with embodiments of the disclosure. Driver system 401y may be configured to provide a plurality of output states. The output states may correspond to, for example, −100V, 0V, and 100V. Driver system 401y may include a multi-output driver 440. Multi-output driver 440 may have a first output 441, a second output 442, and a third output 443. Outputs 441, 442, 443 may correspond to −100V, 0V, and 100V, respectively. Driver system 401y may also include a switch unit 450. Switch unit 450 may include a plurality of separate switches. Switch unit 450 may be configured to operate such that only one connection is allowed at a time. Switch unit 450 includes a first switch 451, a second switch 452, and a third switch 453. In the state shown in FIG. 5A, only third switch 453 is connected. Thus, the output to electrode 411A may be that provided by third output 443.

Control signals may be provided to components of driver system 401y. As shown in FIG. 5A, controller 50 may be configured to control driver system 401y. Controller 50 may be connected to multi-output driver 440 and may be configured to instruct multi-output driver 440 to operate. Controller 50 may be connected to switch unit 450 and may be configured to instruct switch unit 450 to operate. For example, controller 50 may instruct multi-output driver 440 to supply power and instruct switch unit 450 to select one of switches 451, 452, 453 to be connected so that an output state is provided to electrode 411A.

The plurality of switches may enable deflection structure 400 to provide several advantages over conventional scanning deflection drivers, such as those comprising a high voltage linear amplifier and a digital-to-analog converter (DAC) or a continuous time saw tooth signal generator, among others. First, deflection structure 400 can more quickly adjust voltages provided by power supplies because configurations from controller 50 can be directly applied to the switches in the driver systems, thereby enabling a faster manipulation of the beam. In conventional deflection structures, configurations in the form of digital signals transmitted from a controller must be further converted by the digital-to-analog converter to configure the high voltage linear amplifier, thereby causing a delay. A trade off relationship between speed, linearity, and power consumption that may limit performance in conventional scanning deflection systems may be avoided. Moreover, an active device may be operated at a higher speed when it is operated in switch mode. Additionally, compatibility may be improved because more high voltage active devices are generally designed to operate in switch mode rather than linear mode. Operating such devices in linear mode may limit performance in the aspects of linearity and speed, especially when the device is operated under high voltage.

Second, deflection structure 400 may provide a more accurate control input signal (e.g., linearity) since the switches provide desired voltages to the deflection structure even under high speed. On the other hand, the linearity of a high voltage linear amplifier may suffer when a predefined operation voltage of the amplifier is high.

Third, an active device operating in switch mode of deflection structure 400 may waste less power compared to an active device operating in linear mode. On the other hand, the active devices operating in linear mode may consume more power, and the system based on a linear amplifier may be more difficult to maintain.

In some embodiments, each of first driver system 401y and a second driver system 402x may comprise a plurality of physical drivers. Each of the plurality of physical drivers may comprise a power supply providing a discrete output and a switch similar to that described above. The physical driver may be configured to provide a discrete output state to corresponding electrodes (such as electrodes 411A-B and 412A-B).

Figure 5B:
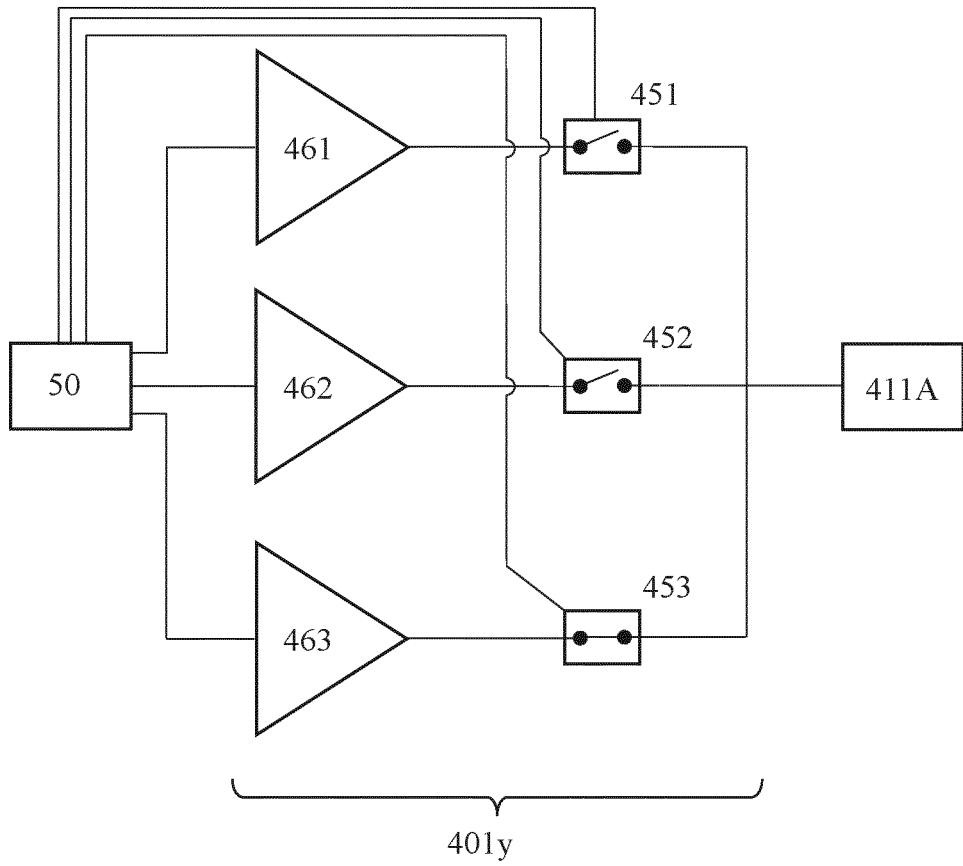
FIG. 5B is a diagram illustrating a plurality of drivers, consistent with embodiments of the present disclosure.

Reference is now made to FIG. 5B, which shows a diagrammatic representation of a plurality of drivers, consistent with embodiments of the disclosure. Driver system 401y may be configured to provide a plurality of output states by providing separate drivers that each produce an output. Each separate driver may be configured to provide its own output. Driver system 401y may include a first driver 461, a second driver 462, and a third driver 463. Each of drivers 461, 462, and 463 may be configured to supply power at a predetermined output. Drivers 461, 462, and 463 are connected to switches 451, 452, and 453, respectively. Controller 50 may be configured to separately operate switches 451, 452, and 453. Controller 50 may be configured to separately operate drivers 461, 462, and 463. Controller 50 may be configured to operate switches so that only one switch is connected at a time. In the state shown in FIG. 5B, only third switch 453 is connected. Thus, output to electrode 411A may be provided only by third driver 463.

Figure 4B:
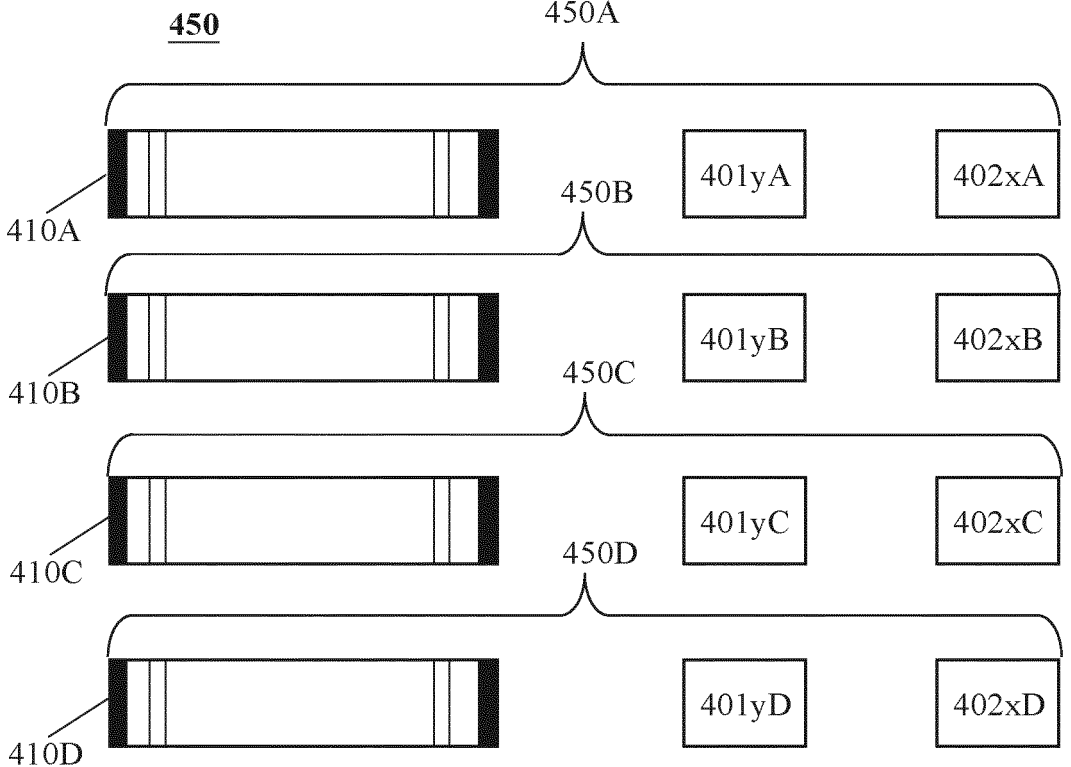
FIG. 4B is a diagram illustrating a cross-sectional view of an illustrative embodiment of a deflection system in multiple layers that may be implemented in a deflection scanning unit in a single or multi-beam inspection system, consistent with embodiments of the present disclosure.

Reference is now made to FIG. 4B, which shows a cross-sectional view of an illustrative embodiment of a deflection system 450 that may be used in an electron beam inspection system, consistent with embodiments of the present disclosure. Deflection system 450 includes deflection structures 450A-D, with each structure in a corresponding layer. Each deflection structure 450A-D comprises a manipulator or multi-pole structure (410A-D) and a plurality of driver systems (401yA-D and 402xA-D). In some embodiments, the plurality of driver systems (401yA-D and 402xA-D) and the multi-pole structure (410A-D) can be implemented in separate layers. Deflection structures 450A-D can function as deflectors implemented in deflection scanning unit 132 shown in FIG. 2 or deflectors 309-1 and 309-2 shown in FIG. 3A, among others. Each of the plurality of driver systems (401yA-D and 402xA-D) is electrically connected to a set of opposing electrodes implemented in the multi-pole structure (410A-D) and configured to provide a plurality of discrete output states to the set of opposing electrodes implemented in the multi-pole structure. For example, driver 401yA may be electrically connected to a set of opposing electrodes implemented in multi-pole structure 410A and driver 402xA may be electrically connected to another set of opposing electrodes in multi-pole structure 410A. Deflection structures 450A-D and deflection structure 400 (depicted in FIG. 4A) share the same functionalities, such as manipulating an electron beam. Multi-pole structures 410A-D and multi-pole structure 410 (depicted in FIG. 4A) share the same functionalities to deflect an electron beam in a direction when provided with output states from driver systems. Driver systems 401A-D and 402A-D and driver systems 401y and 402x (depicted in FIG. 4A) share the same functionalities providing discrete output states to multi-pole structures to deflect the beam. Moreover, while FIG. 4B shows four layers of deflection structures 450A-D, it is appreciated that deflection structures can be implemented in any number of layers.

While in the embodiments of FIG. 4B each layer of the multiple layers (e.g., 410A-D) is sized to have substantially the same dimensions, the size of each layer can be determined by physical dimensions (such as a length, an inner diameter, and an outer diameter) of the electrodes implemented in the layer and corresponds to the deflection angles. For example, a deflection structure (such as 450A-D) in each layer may deflect an electron beam in a substantially identical deflection angle when driver systems 401yA-D and 402xA-D provide substantially identical output states to electrodes of multi-pole structures 410A-D. In another example, a deflection structure (such as 450A-D) in each layer may deflect an electron beam in a different deflection angle when its corresponding driver system (e.g., 401yA-D and 402xA-D) provides different output states to electrodes of its corresponding multi-pole structure (e.g., 410A-D).

In some embodiments, one or more of multiple layers (such as a layer including deflection structures 450D) can be implemented with a driver system comprising a linear amplifier with limited output voltage swing to provide finer deflection control by enabling the embodiments to provide high resolution output voltage to electrodes in one layer of the multiple layer structure. For example, when a scanning deflection system in an electron beam inspection system is configured to deflect an electron beam with the deflection equivalent to applying 155V to a single conventional multi-pole structure of the same size as one of 410A-D, a controller may configure switches connected to a multi-pole structure (such as one of 450A-C) to transmit 50V from a discrete power supply implemented in each deflection structure. Thus, the electrode pairs in three of the four multi-pole structures in FIG. 4B may be connected to −25V and +25V respectively. To achieve the remaining part of deflection equivalent to applying 5V to a conventional multi-pole structure of the same size, the controller may configure a deflection structures (such as 450D) implemented with the aforementioned linear amplifier supplying −2.5V and 2.5V to the multi-pole structure. However, since this linear amplifier has a much more limited range than would be needed with existing deflectors, it may be much easier to implement, may be faster, may have lower power, etc. as compared to one used with an existing deflector.

Figure 4C:
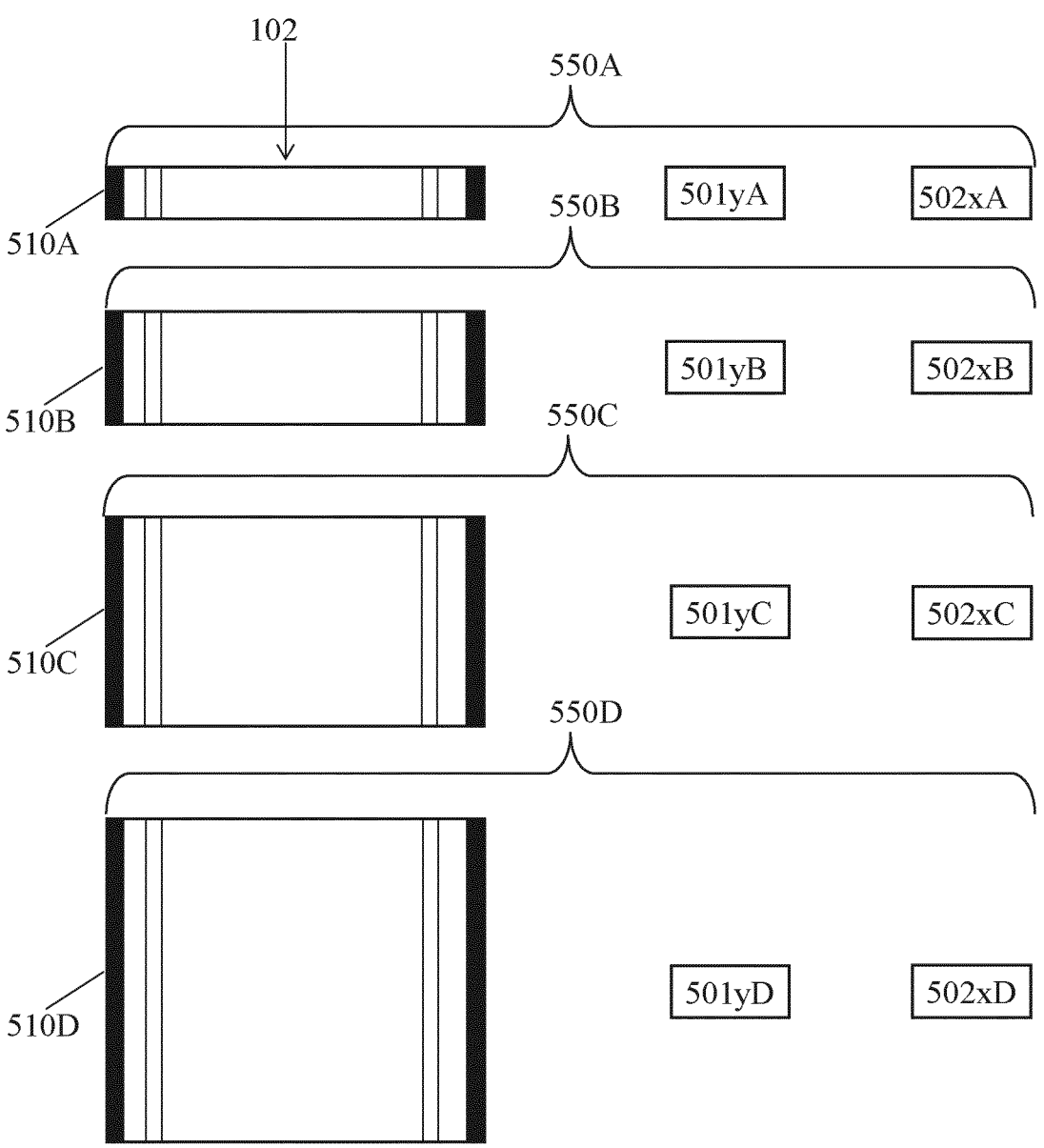
FIG. 4C is a diagram illustrating a cross-sectional view of another illustrative embodiment of a deflection system in multiple layers that may be implemented in a deflection scanning unit in a single or multi-beam inspection system.

Reference is now made to FIG. 4C, which shows a cross-sectional view of another deflection system 550 that may be used in an electron beam inspection system, consistent with embodiments of the present disclosure. Deflection system 550 includes deflection structures 550A-D, with each structure in a corresponding layer. Each deflection structure 550A-D comprises a manipulator or multi-pole structure (510A-D) connected to a plurality of drivers (501yA-D and 502xA-D). In some embodiments, the plurality of driver systems (501yA-D and 502xA-D) and the multi-pole structure (510A-D) can be implemented in a separate layer. Deflection structures 550A-D can function as deflectors implemented in deflection scanning unit 132 shown in FIG. 2 or deflectors 309-1 and 309-2 shown in FIG. 3A. Each of the plurality of driver systems (501yA-D and 502xA-D) is electrically connected to a set of opposing electrodes implemented in the multi-pole structure (510A-D) and configured to provide a plurality of discrete output states to the set of opposing electrodes implemented in the multi-pole structure. For example, driver 501yA may be electrically connected to a set of opposing electrodes implemented in multi-pole structure 510A and driver 502xA may be electrically connected to another set of opposing electrodes in multi-pole structure 510A. Deflection structures 550A-D and deflection structures 450A-D (depicted in FIG. 4B) share the same functionalities, such as manipulating an electron beam. Multi-pole structures 510A-D and multi-pole structures 410A-D (depicted in FIG. 4B) share the same functionalities to deflect an electron beam in a direction when provided with output states from driver systems. Driver systems 501yA-D and 502xA-D and driver systems 401yA-D and 402xA-D (depicted in FIG. 4B) share the same functionalities providing discrete output states to multi-pole structures to deflect the beam. Moreover, while FIG. 4C shows four layers of deflection structures 550A-D, it is appreciated that deflection structures can be implemented in any number of layers.

In this embodiment, each layer among the multiple layers is sized to be different in length, thus deflection angles from each layer is different when a substantially identical output state is provided to each of the layers. In some embodiments, each of the layers can be sized to be a different ratio of a size of the smallest layer. A size of a first structure may be N, and a size of a second structure may be M, with a ratio of N to M satisfying a relationship. For example, in the embodiment of FIG. 4C, the lengths of multi-pole structures 510A-D are N for 510A, 2N for 510B, 4N for 510C, and 8N for 510D respectively. When driver systems 501A-D and 502A-D provide an identical output state to each of multi-pole structures 510A-D, multi-pole structure 510D generates the highest deflection angle due to its length (e.g., 8N) along the direction of the Z-axis direction (e.g., along primary optical axis 100_1 as shown in FIG. 2) being the longest, multi-pole structure 510C generates the second highest deflection angle, multi-pole structure 510B generates the third highest deflection angle, and multi-pole structure 510A generates the least deflection angle. The deflection angles are proportionate to the lengths of multi-pole structures when the driver systems provide the identical output state to all multi-pole structures. Moreover, while FIG. 4C shows sizes of layers increase in the direction of travel of a beam through the deflectors (e.g., along primary optical axis 100_1), it is appreciated that different arrangements of sizes of layers can be implemented in the deflection system.

In some embodiments, one or more of multiple layers (such as a layer that includes deflection structure 550A) can be implemented with a driver system comprising a linear amplifier with limited output voltage swing to provide finer deflection control. That is, rather than being limited to only discrete output states, such a layer may be configured to provide a variable range of output. This may enable embodiments to provide high resolution output voltage to electrodes in one layer of the multiple layer structure. For example, when a scanning deflection system in an electron beam inspection system is configured to deflect an electron beam with the deflection equivalent to applying 155V to a single conventional multi-pole structure of the same size as that of 510A, a controller may configure switches connected to a multi-pole structure (such as 510B) to transmit −37.5V and +37.5V from a discrete power supply electrically connected thereto. To achieve the remaining part of deflection equivalent to applying 5V to a conventional multi-pole structure of the same size as that of 510A, the controller may configure a deflection structure (such as deflection structure 550A) implemented with the aforementioned linear amplifier and apply −2.5 and +2.5V to the multi-pole structure.

In some embodiments, only one layer of a multiple layer structure may be provided with a linear amplifier and configured to provide output swing. This one layer may be the smallest layer among the multiple layer structure. The one layer configured to provide output swing may constitute the finest level of control for deflecting a charged particle beam.

Figure 4D:
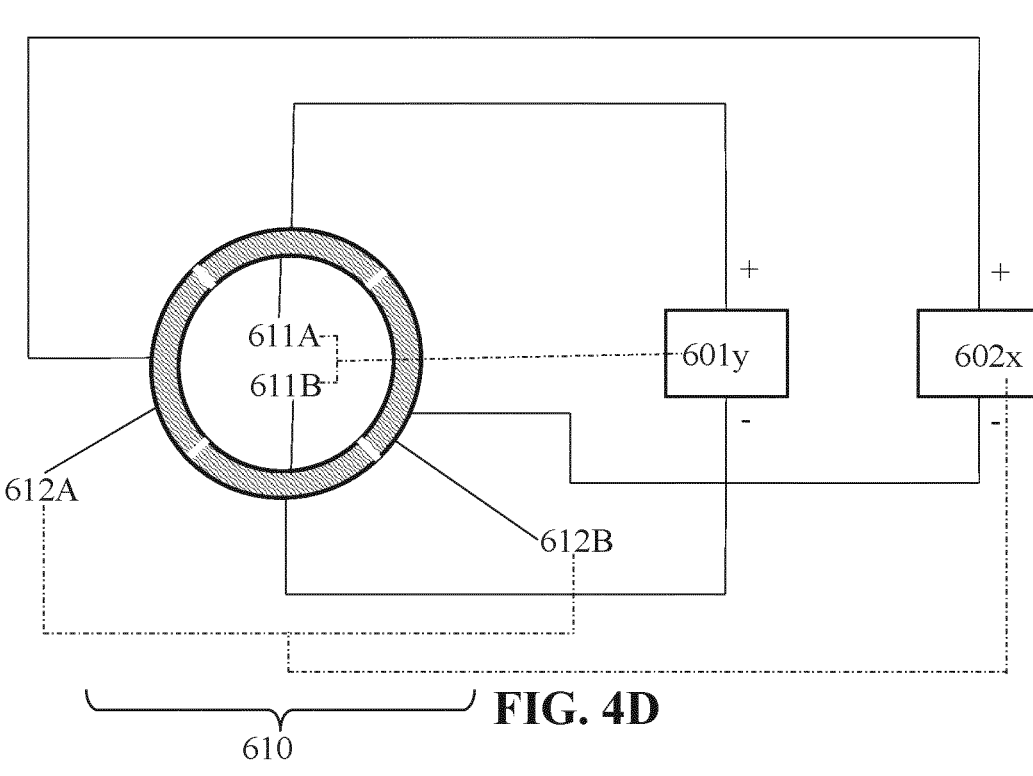
FIG. 4D is a diagram illustrating a plan view of an embodiment of a deflection system with a manipulator having smaller diameter than that of FIG. 4A, consistent with embodiments of the present disclosure.
Figure 4E:
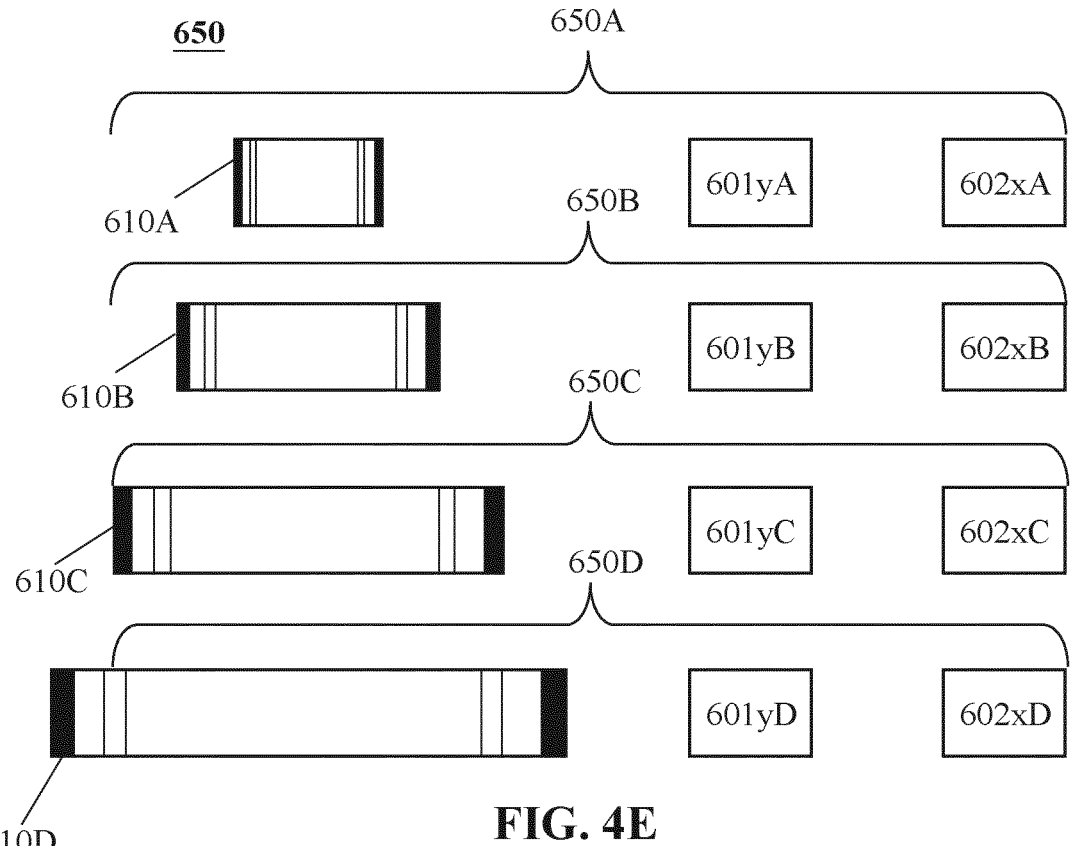
FIG. 4E is a diagram illustrating a cross-sectional view of an illustrative embodiment of a deflection system in multiple layers that may be implemented in a deflection scanning unit in a single or multi-beam inspection system.

Reference is now made to FIG. 4D, which shows a plan view of an illustrative embodiment of a deflection structure 600 that may be implemented in an electron beam inspection system, consistent with embodiments of the present disclosure. As shown in FIG. 4D, deflection structure 600 includes a multi-pole structure 610, a first driver system 601$y$, and a second driver system 602$x$. Multi-pole structure 610 includes a first set of opposing electrodes 611A-B and a second set of opposing electrodes 612A-B that can be configured to deflect the electron beam in each deflection direction (such as the y-direction or x-direction) based on output states applied to each set. Deflection structure 600 of FIG. 4D is similar to deflection structure 400 of FIG. 4A except that diameters of electrodes 611A-D may be different. Furthermore, diameters of electrodes in different layers may be different. For example, as shown in FIG. 4E, the inner diameter and outer diameters of the electrodes in a multipole structure 610A may be reduced relative to that of others.

Figure 4F:
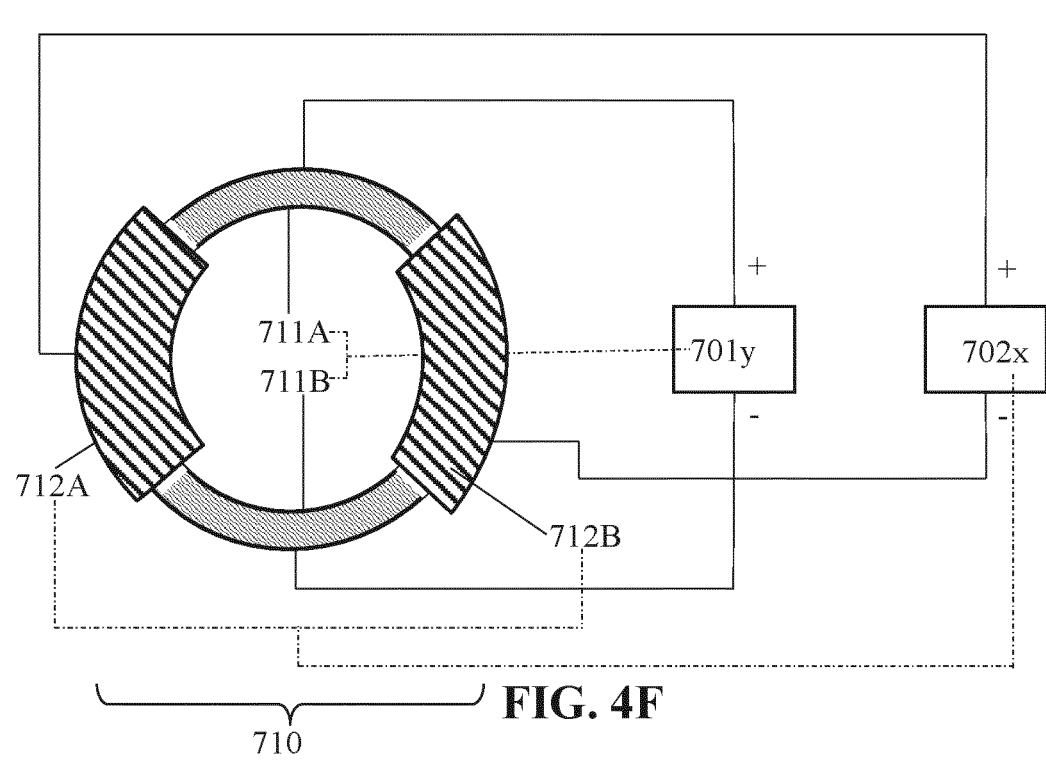
FIG. 4F is a diagram illustrating a cross-sectional view of another illustrative embodiment of a deflection system in multiple layers that may be implemented in a deflection scanning unit in a single or multi-beam inspection system.
Figure 4G:
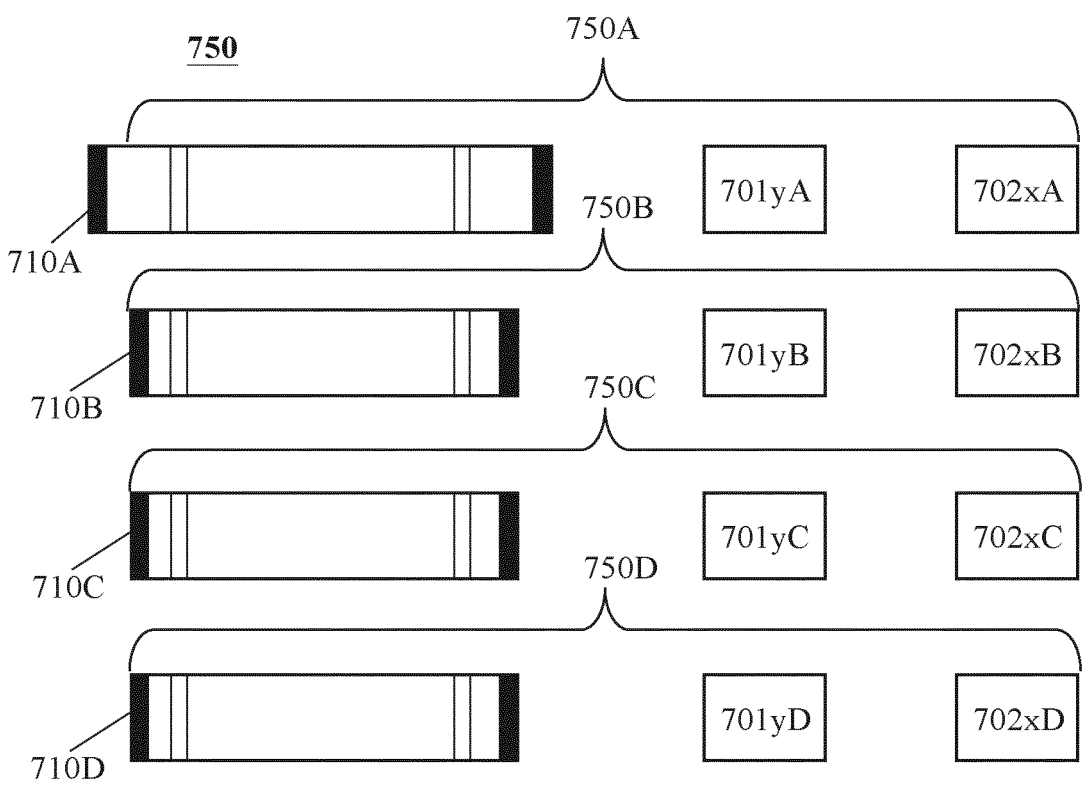
FIG. 4G is a diagram illustrating a cross-sectional view of another illustrative embodiment of a deflection system in multiple layers that may be implemented in a deflection scanning unit in a single or multi-beam inspection system.

Furthermore, in some embodiments, diameters of electrodes in the same layer may be varied. For example, as shown in FIGS. 4F, 4G, electrodes 712A-B may be different from those of electrodes 711A-B.

Reference is now made to FIG. 6, which is a flow chart illustrating an exemplary method 800 of controlling a plurality of driver systems to dynamically deflect an electron beam, consistent with embodiments of the present disclosure. Method 800 may be performed by an electron beam tool (e.g., electron beam tool 100 of FIG. 2). In particular, a controller (e.g., controller 50 of FIG. 2) of the electron beam tool may perform method 800.

In step 810, a first driver system (e.g., driver system 401$y$A of FIG. 4B) in a first deflection structure (e.g., first deflection structure 450A of FIG. 4B) may provide a first set of discrete output states to a first set of opposing electrodes of a deflection scanning unit (e.g., deflection scanning unit 132 of FIG. 2). to influence an electron beam. Influencing a beam may involve directing or deflecting the beam. In some embodiments, the first driver system is electrically connected to the first set of opposing electrodes and configured to provide a plurality of discrete output states to the first set of opposing electrodes.

In some embodiments, the output states may include −100V, 0V, and +100V. In other embodiments, the output states may include −100V, −50V, 0V, +50V, and +100V. It is appreciated that different combinations of discrete output states can be provided by driver systems.

In step 820, a second driver system (e.g., driver system 402$x$A of FIG. 4B) in the first deflection structure may provide a second set of discrete output states to a second set of opposing electrodes of the deflection scanning unit to influence (e.g., direct) the electron beam. In some embodiments, the second driver system is electrically connected to the second set of opposing electrodes and configured to provide a plurality of discrete output states to the second set of opposing electrodes.

In some embodiments, such as those wherein a deflection system (e.g., deflection system 450 of FIG. 4B) includes another layer comprising a second deflection structure (e.g., deflection structure 450B of FIG. 4B), steps 830 and 840 may be further performed. In step 830, a third driver system (e.g., driver system 401$y$B of FIG. 4B) in the second deflection structure may provide a third set of discrete output states to a third set of opposing electrodes of the deflection scanning unit to influence (e.g., direct) the electron beam. In some embodiments, the third driver system is electrically connected to the third set of opposing electrodes and configured to provide a plurality of discrete output states to the third set of opposing electrodes.

In step 840, a fourth driver system (e.g., driver system 402$x$B of FIG. 4B) in the second deflection structure may provide a fourth set of discrete output states to a fourth set of opposing electrodes of the deflection scanning unit to influence (e.g., direct) the electron beam. In some embodiments, the fourth driver system is electrically connected to the fourth set of opposing electrodes and configured to provide a plurality of discrete output states to the fourth set of opposing electrodes. In some embodiments, the second deflection structure may be placed in a different layer from the first deflection structure. Moreover, the sets of opposing electrodes may be any type of multi-pole structure (such as multi-pole structures 410A or 410B of FIG. 4B), such as a dipole (2-pole) structure, a quadrupole (4-pole) structure, an octupole (8-pole) structure, etc.

In some embodiments, such as those wherein deflection system 450 includes another layer comprising a third deflection structure (e.g., deflection structure 450C of FIG. 4B), step 850 may be further performed. In step 850, a linear driver system in the third deflection system is instructed to control output states of another set of electrodes to influence the electron beam. In some embodiments, the linear driver system is electrically connected to the set of electrodes and configured to provide a continuous output state to the set of electrodes. The linear driver system may be used for the deflection of a beam in both directions (e.g., in both the x-direction and y-direction).

Figure 7A:
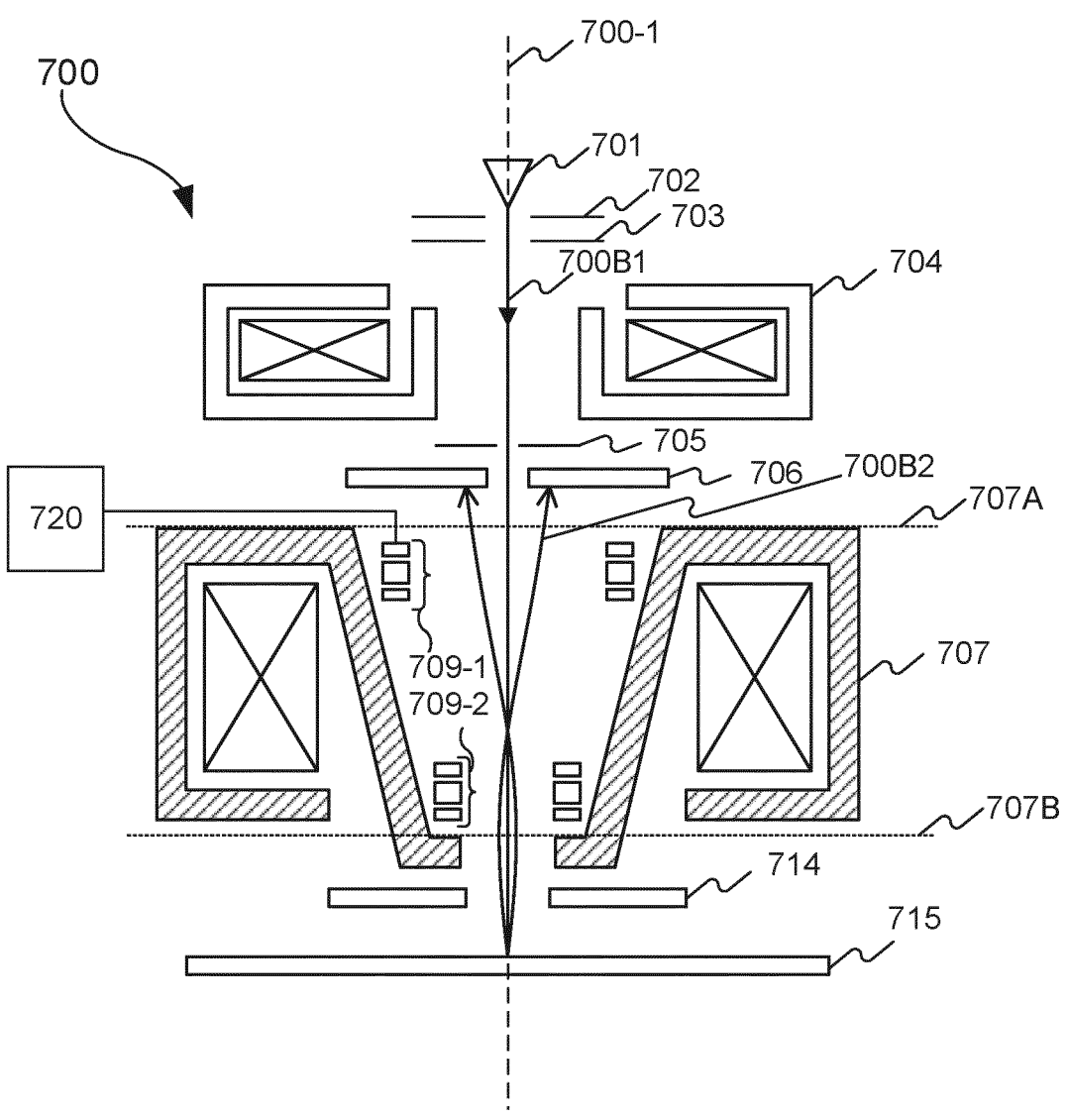
FIG. 7A is a schematic diagram illustrating an exemplary configuration of a charged-particle beam apparatus comprising a plurality of charged-particle beam deflectors, consistent with embodiments of the present disclosure.

Reference is now made to FIG. 7A, which illustrates an exemplary charged-particle beam apparatus 700 (also referred to as apparatus 700) comprising charged-particle beam deflectors 709-1 and 709-2 (also referred to as primary electron beam deflectors 709-1 and 709-2), consistent with embodiments of the present disclosure. Apparatus 700 may comprise a charged-particle source such as, an electron source configured to emit primary electrons from a cathode 701 and extracted using an extractor electrode 702 to form a primary electron beam 700B1 along a primary optical axis 700-1. Apparatus 700 may further comprise an anode 703, a condenser lens 704, a beam-limiting aperture array 705, signal electron detector 706, an objective lens 707, a scanning deflection unit comprising primary electron beam deflectors 709-1 and 709-2 configured to be controlled by a deflection control unit 720, a control electrode 714, and a sample 715. It is to be appreciated that relevant components may be added, omitted, or reordered, as appropriate. It is also to be appreciated that in the context of this disclosure, a charged-particle beam apparatus may refer to an electron beam apparatus, a primary charged-particle beam may refer to a primary electron beam, and a charged-particle beam deflector may refer to an electron beam deflector, unless stated otherwise.

An electron source (not shown) may include a thermionic source configured to emit electrons upon being supplied thermal energy to overcome the work function of the source, a field emission source configured to emit electrons upon being exposed to a large electrostatic field, etc. In the case of a field emission source, the electron source may be electrically connected to a controller, such as controller 50 of FIG. 2, configured to apply and adjust a voltage signal based on a desired landing energy, sample analysis, source characteristics, among other things. Extractor electrode 702 may be configured to extract or accelerate electrons emitted from a field emission gun, for example, to form primary electron beam 700B1 that forms a virtual or a real primary beam crossover (not illustrated) along primary optical axis 700-1. Primary electron beam 700B1 may be visualized as being emitted from the primary beam crossover. In some embodiments, controller 50 may be configured to apply and adjust a voltage signal to extractor electrode 702 to extract or accelerate electrons generated from electron source. An amplitude of the voltage signal applied to extractor electrode 702 may be different from the amplitude of the voltage signal applied to cathode 701. In some embodiments, the difference between the amplitudes of the voltage signal applied to extractor electrode 702 and to cathode 701 may be configured to accelerate the electrons downstream along primary optical axis 700-1 while maintaining the stability of the electron source. As used in the context of this disclosure, "downstream" refers to a direction along the path of primary electron beam 700B1 starting from the electron source towards sample 715. With reference to positioning of an element of a charged-particle beam apparatus (e.g., apparatus 700 of FIG. 7A), "downstream" may refer to a position of an element located below or after another element, along the path of primary electron beam starting from the electron source, and "immediately downstream" refers to a position of a second element below or after a first element along the path of primary electron beam 700B1 such that there are no other active elements between the first and the second element. For example, as illustrated in FIG. 7A, charged-particle beam deflector 709-1 may be positioned downstream from condenser lens 704 and signal electron detector 706 may be positioned immediately downstream of beam-limiting aperture array 705 such that there are no other optical or electron-optical elements placed between beam-limiting aperture array 705 and electron detector 706. As used in the context of this disclosure, "upstream" may refer to a position of an element located above or before another element, along the path of primary electron beam starting from the electron source, and "immediately upstream" refers to a position of a second element above or before a first element along the path of primary electron beam 700B1 such that there are no other active elements between the first and the second element. As used herein, "active element" may refer to any element or component, the presence of which may modify the electromagnetic field between the first and the second element, either by generating an electric field, a magnetic field, or an electromagnetic field.

Apparatus 700 may comprise condenser lens 704 configured to receive a portion of or a substantial portion of primary electron beam 700B1 and to focus primary electron beam 700B1 on beam-limiting aperture array 705. Condenser lens 704 may be substantially similar to condenser lens 110 of FIG. 2 and may perform substantially similar functions. Although shown as a magnetic lens in FIG. 7A, condenser lens 704 may be an electrostatic, a magnetic, an electromagnetic, or a compound electromagnetic lens, among others. Condenser lens 704 may be electrically coupled with controller 50. Controller 50 may apply an electrical excitation signal to condenser lens 704 to adjust the focusing power of condenser lens 704 based on factors including, but are not limited to, operation mode, application, desired analysis, sample material being inspected, among other things.

Apparatus 700 may further comprise beam-limiting aperture array 705 configured to limit beam current of primary electron beam 700B1 passing through one of a plurality of beam-limiting apertures of beam-limiting aperture array 705. Although, only one beam-limiting aperture is illustrated in FIG. 7A, beam-limiting aperture array 705 may include any number of apertures having uniform or non-uniform aperture size, cross-section, or pitch. In some embodiments, beam-limiting aperture array 705 may be disposed downstream of condenser lens 704 or immediately downstream of condenser lens 704 and substantially perpendicular to primary optical axis 700-1. In some embodiments, beam-limiting aperture array 705 may be configured as an electrically conducting structure comprising a plurality of beam-limiting apertures. Beam-limiting aperture array 705 may be electrically connected via a connector (not illustrated) with controller 50, which may be configured to instruct that a voltage be supplied to beam-limiting aperture array 705. The supplied voltage may be a reference voltage such as, for example, ground potential. Controller 50 may also be configured to maintain or adjust the supplied voltage. Controller 50 may be configured to adjust the position of beam-limiting aperture array 705.

Apparatus 700 may comprise one or more signal electron detectors 706. Signal electron detector 706 may be configured to detect substantially all secondary electrons and a portion of backscattered electrons based on the emission energy, emission polar angle, emission azimuthal angle of the backscattered electrons, among other things. In some embodiments, signal electron detector 706 may be configured to detect secondary electrons, backscattered electrons, or auger electrons. Signal electrons having low emission energy (typically ≤50 eV) or small emission polar angles, emitted from sample 715 may comprise secondary electron beam(s) 700B2, and signal electrons having high emission energy (typically >50 eV) and medium emission polar angles may comprise backscattered electron beam(s) (not shown). In some embodiments, 700B2 may comprise secondary electrons, low-energy backscattered electrons, or high-energy backscattered electrons with small emission polar angles. It is appreciated that although not illustrated, a portion of backscattered electrons may be detected by signal electron detector 706. In overlay metrology and inspection applications, signal electron detector 706 may be useful to detect secondary electrons generated from a surface layer and backscattered electrons generated from the underlying deeper layers, such as deep trenches or high aspect-ratio holes.

Apparatus 700 may further include compound objective lens 707 configured to focus primary electron beam 700B1 on a surface of sample 715. Objective lens 707 may be further configured to focus signal electrons, such as secondary electrons having low emission energies, or backscattered electrons having high emission energies, on a detection surface of a signal electron detector (e.g., in-lens signal electron detector 706). Objective lens 707 may be substantially similar to or perform substantially similar functions as objective lens assembly 131 of FIG. 2.

In some embodiments, objective lens 707 may comprise a cavity defined by the space between imaginary planes 707A and 707B. It is to be appreciated that imaginary planes 707A and 707B, marked as broken lines in FIG. 7A, are visual aids for illustrative purposes only. Imaginary plane 707A, located closer to condenser lens 704, may define the upper boundary of the cavity, and imaginary plane 707B, located closer to sample 715, may define the lower boundary of the cavity of objective lens 707. As used herein, the "cavity" of the objective lens refers to space defined by the element of the magnetic lens configured to allow passage of the primary electron beam, wherein the space is rotationally symmetric around the primary optical axis. The term "within the cavity of objective lens" or "inside the cavity of the objective lens" refers to the space bound within the imaginary planes 707A and 707B and the internal surface of the magnetic lens directly exposed to the primary electron beam. Planes 707A and 707B may be substantially perpendicular to primary optical axis 700-1. Although FIG. 7A illustrates a conical cavity, the cross-section of the cavity may be cylindrical, conical, staggered cylindrical, staggered conical, or any suitable cross-section.

Apparatus 700 may further include a scanning deflection unit comprising primary charged-particle beam deflectors (e.g., electron beam deflectors) 709-1 and 709-2, configured to deflect and to scan primary electron beam 700B1 on a surface of sample 715 to form a field-of-view (FOV). In some embodiments, scanning deflection unit comprising primary electron beam deflectors 709-1 and 709-2 may be referred to as beam manipulators or a beam manipulator assembly. The dynamic deflection of primary electron beam 700B1 may cause a desired area or a desired region of interest of sample 715 to be scanned, for example in a raster scan pattern, to generate SEs and BSEs for sample inspection. One or more primary electron beam deflectors 709-1 and 709-2 may be configured to deflect primary electron beam 700B1 in X-axis or Y-axis, or a combination of X- and Y-axes. As used herein, X-axis and Y-axis form Cartesian coordinates, and primary electron beam 700B1 propagates along Z-axis or primary optical axis 700-1.

Electrons are negatively charged particles and travel through the electron-optical column, and may do so at high energy and high speeds. One way to deflect the electrons is to pass them through an electric field or a magnetic field generated, for example, by a pair of plates held at two different potentials, or passing current through deflection coils, among other techniques. Varying the electric field or the magnetic field across a deflector such as primary electron beam deflector 709-1 or 709-2 may vary the deflection angle of electrons in primary electron beam 700B1 based on factors including, but are not limited to, electron energy, magnitude of the electric field applied, dimensions of deflectors, among other things.

In some embodiments, one or both primary electron beam deflectors 709-1 and 709-2 may be located within the cavity of objective lens 707. As illustrated in FIG. 7A, primary electron beam deflectors 709-1 and 709-2, in their entirety, may be located within the cavity of objective lens 707. In some embodiments, at least one primary electron beam deflector, in its entirety, may be located within the cavity of objective lens 707. A beam deflector (e.g., primary electron beam deflector 709-1) may be disposed circumferentially along the inner surface of objective lens 707. One or more primary electron beam deflectors may be placed between signal electron detector 706 control electrode 714. In some embodiments, all primary electron beam deflectors may be placed between signal electron detector 706 and control electrode 714.

In some embodiments, primary electron beam deflectors 709-1 and 709-2 may comprise electrostatic deflectors or magnetic deflectors. Electron beam deflector 709-1 may also be referred to as an "upper deflector" and electron beam deflector 709-2 may be referred to as a "lower deflector." As used herein, "upper" and "lower" indicate relative locations of the deflectors with respect to the trajectory of primary electron beam 700B1. As used herein, upper deflector refers to the deflector located upstream and closer to electron source, and lower deflector refers to the deflector downstream from the upper deflector and closer to sample 715. Although FIG. 7A illustrates only two primary electron beam deflectors 709-1 and 709-2, it is to be appreciated that charged-particle beam apparatus 700 may comprise two or more deflectors, as appropriate.

Figure 7B:
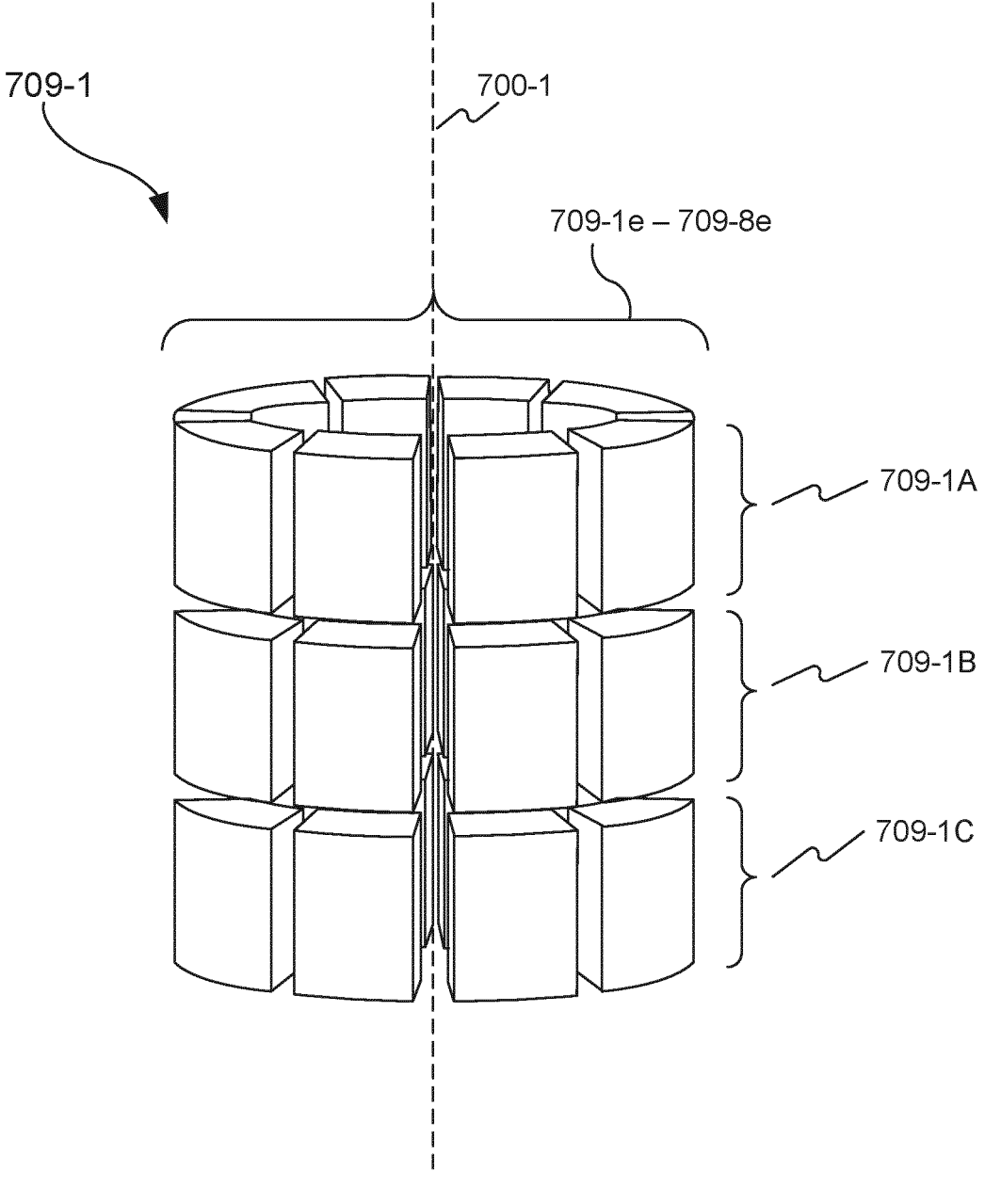
FIG. 7B is a schematic diagram illustrating an exemplary configuration of a segmented charged-particle beam deflector of FIG. 7A, consistent with embodiments of the present disclosure.

In some embodiments, each of upper deflector 709-1 and lower deflector 709-2 may comprise a segmented deflector. FIG. 7B illustrates an exemplary structure of a segmented electron beam deflector 709-1, consistent with embodiments of the present disclosure. Electron beam deflector 709-1 may comprise segments 709-1A, 709-1B, and 709-1C disposed coaxially along primary optical axis 700-1. Segments 709-1A, 709-1B, and 709-1C may have substantially similar inner radius or different inner radii with reference to primary optical axis 700-1, and the length of segments 709-1A, 709-1B, and 709-1C may be substantially similar or different. As illustrated, each segment may comprise a multi-pole structure with eight electrodes 709-1e-709-8e arranged radially with respect to primary optical axis 700-1 and configurable to function in different ways based on the voltages applied to each of the electrodes. Multiple pairs of electrodes may be combined so that deflection in a two-dimensional plane is possible. In some embodiments, each segment (segments 709-1A, 709-1B, and 709-1C) may comprise a multi-pole structure with two electrodes (dipole), four electrodes (quadrupole), or eight electrodes (octupole), or any number of electrodes, as desired. Each segment (segments 709-1A, 709-1B, and 709-1C) may comprise the same number or a different number of electrodes. Although FIG. 7B illustrates a deflector structure comprising three segments, and each segment comprising eight electrodes, deflectors may include fewer or more segments and fewer or more electrodes. In some embodiments, the number of segments in upper deflector 709-1 and lower deflector 709-2 may be different. It is to be appreciated that although FIG. 7A illustrates an apparatus 700 comprising two segmented deflectors, two or more segmented deflectors may be used, as appropriate.

In some embodiments, electrodes 709-1e-709-8e of segments 709-1A, 709-1B, and 709-1C may be held in position by a support structure (not shown), such as a ring, a sleeve, a brace, among other supporting structures. The support structure may be made from a non-conductive material including, but not limited to, a ceramic, a glass, or the like.

Referring back to FIG. 7A, sample 715 may be disposed on a plane substantially perpendicular to primary optical axis 700-1. The position of the plane of sample 715 may be adjusted along primary optical axis 700-1 such that a distance between sample 715 and pole-piece of objective lens 707 may be adjusted. In some embodiments, sample 715 may be electrically connected via a connector (not illustrated) with controller 50 which may be configured to supply a voltage to sample 715 to cause movement of sample 715 along primary optical axis 700-1. Controller 50 may also be configured to maintain or adjust the supplied voltage. It is to be appreciated that sample 715 may be placed on a sample holder or a stage configured to receive a signal from a controller, for example, to adjust the height of the sample along primary optical axis 700-1. In some embodiments, the movement of sample 715 or the sample stage along primary optical axis 700-1 may be controlled using mechanical, electromechanical mechanisms, or other suitable movement mechanisms.

Apparatus 700 may further include deflection control unit 720 (described with reference to FIG. 7C) configured to control operation of primary electron beam deflectors 709-1 and 709-2. Although deflection control unit 720 is illustrated as a separate control unit in FIG. 7A, it may be integrated with controller 50 such that it is a part of controller 50. Deflection control unit 720 may include circuitry and components configured to supply power, generate and supply electrical signals to one or more components such as amplifiers, digital-to-analog converters, distributed output stages, etc., among other functionalities. In some embodiments, deflection control unit 720 may comprise electronic driver circuitry to individually control operation of each segment of electron beam deflectors (e.g., primary electron beam deflectors 709-1 and 709-2).

Figure 7C:
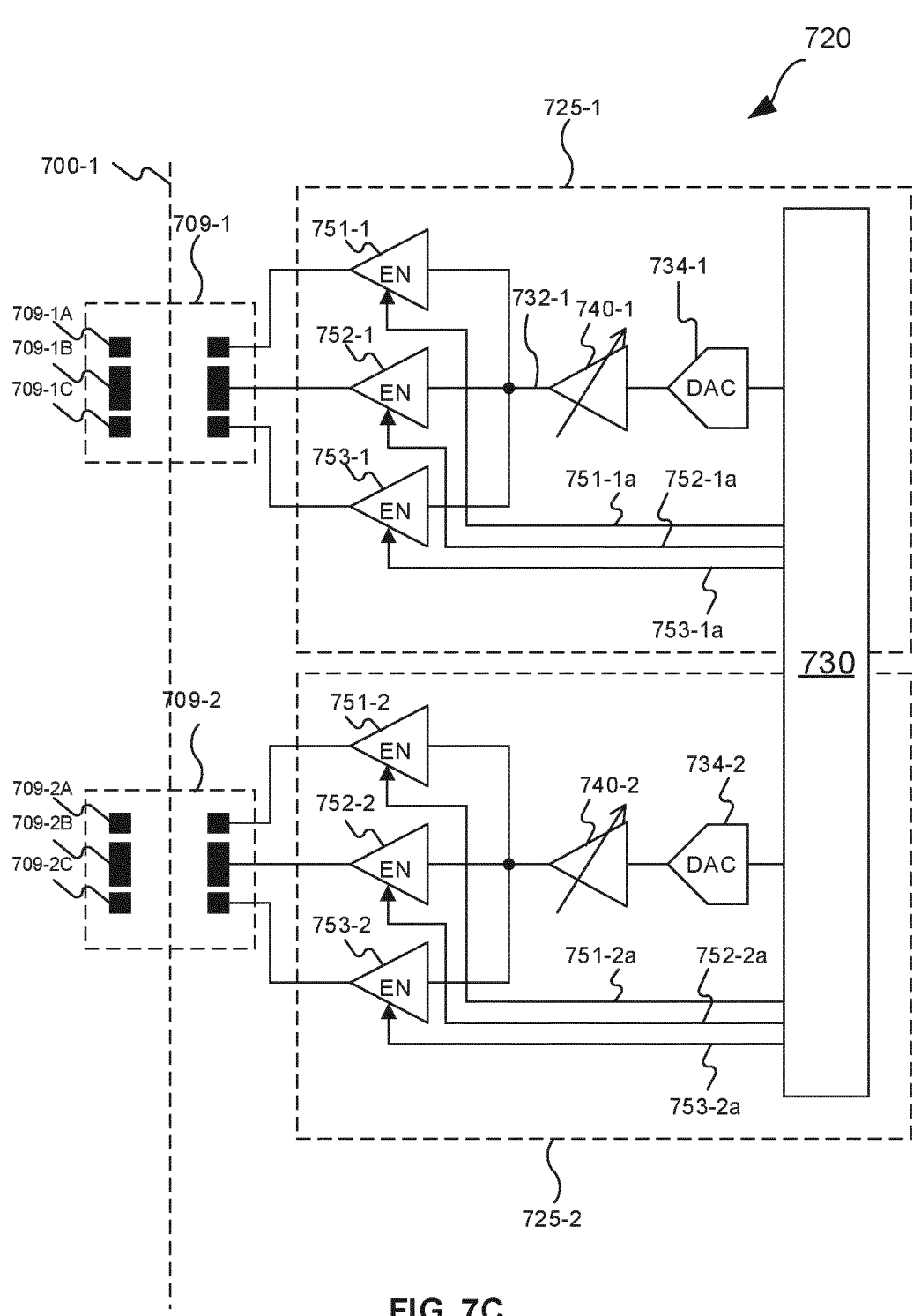
FIG. 7C is a schematic diagram illustrating an exemplary configuration of control circuitry associated with segmented charged-particle beam deflectors, consistent with embodiments of the present disclosure.

Reference is now made to FIG. 7C, which illustrates an exemplary configuration of deflection control unit 720 associated with segmented charged-particle beam deflectors (e.g., primary electron beam deflectors 709-1 and 709-2), consistent with embodiments of the present disclosure. As illustrated, each primary electron beam deflector may be electronically driven by a corresponding driver system. As an example, deflection control unit 720 may comprise a driver system 725-1 associated with primary electron beam deflector 709-1, and a driver system 725-2 associated with primary electron beam deflector 709-2. Driver system 725-1 may comprise a scan control unit 730, a digital-to-analog converter 734-1, a variable gain amplifier 740-1, and distributed output stages 751-1, 752-1, and 753-1. It is to be appreciated that although not illustrated, driver system 725-1 may include other components and circuitry such as power supplies, timing circuits, etc. as appropriately needed to manipulate primary electron beam traveling along primary optical axis 700-1.

Scan control unit 730 may be configured to generate and supply control signals 751-1a, 752-1a, and 753-1a, configured to activate an enable or a disable state of the corresponding distributed output stage. Scan control unit 730 may be further configured to generate a deflection signal 732-1 configured to be applied to one or more segments 709-1A, 709-1B, and 709-1C of primary electron beam deflector 709-1. In some embodiments, deflection control unit 720 may comprise a single scan control unit 730 configured to generate and supply control signals and deflection signals for multiple driver systems (e.g., 725-1 and 725-2). Deflection signal 732-1 may comprise a voltage signal applied to one or more segment of a primary electron beam deflector.

In some embodiments, driver system 725-1 may comprise circuitry such as digital-to-analog converter 734-1, configured to convert digital deflection signal 732-1 to an analog deflection signal. Driver system 725-1 may further comprise circuitry such as variable gain amplifier 740-1, configured to receive the analog deflection signal and generate a tunable amplitude of the deflection signal. In general, VGAs are signal-conditioning amplifiers with electronically settable voltage gain. Variable gain amplifier 740-1 may comprise an analog VGA, or a digital VGA, or any suitable circuitry. In some embodiments, driver system 725-1 may further comprise circuitry such as distributed output stages, implemented as a plurality of direct-coupled amplifiers, or relays, or other suitable circuitry.

In an exemplary configuration of deflection control unit 720 such as illustrated in FIG. 7C, segments 709-1A, 709-1B, and 709-1C of primary electron beam deflector 709-1 may be connected to distributed output stages 751-1, 752-1, and 753-1, respectively. The enable or disable status of distributed output stages 751-1, 752-1, and 753-1 may be activated by control signals 751-1a, 752-1a, and 753-1a, respectively, supplied by scan control unit 730. Variable gain amplifier 740-1 may be configured to output a tunable amplitude of deflection signal 732-1 applied to primary electron beam deflector 709-1 while maintaining low noise levels. In enable mode, activated by a control signal supplied by scan control unit 730, a distributed output stage (e.g., 751-1, 752-1, or 753-1) may reproduce the output signal from variable gain amplifier 740-1 to drive a corresponding segment of primary electron beam deflector 709-1. As an example, control signal 751-1a may activate an enable status of distributed output stage 751-1 such that distributed output stage 751-1 may reproduce the adjusted output signal comprising tunable amplitude of deflection signal 732-1 from variable gain amplifier 740-1 to be applied to segment 709-1A of primary electron beam deflector 709-1. The primary electron beam may be deflected based on the deflection signal applied to segment 709-1A of primary electron beam deflector 709-1. In some embodiments, in disable mode of a distributed output stage (e.g., 751-1, 752-1, or 753-1), the output signal may be grounded, and the distributed output stage may be powered down. Such a configuration may help reduce power consumption, among other advantages. Driver system 725-2 may be substantially similar to and may perform substantially similar functions as driver system 725-1 to control primary electron beam deflector 709-2. It is to be appreciated that apparatus 700 may comprise two or more primary electron beam deflectors and corresponding driver systems.

Some of the advantages of a beam deflection system comprising segmented deflectors (e.g., primary electron beam deflectors 709-1 and 709-2) controlled by a driver system (e.g., driver system 725-1) such as illustrated in FIG. 7C, include, but are not limited to:

i. Adjustment of an effective length, or a deflection sensitivity of a beam deflector by activating or deactivating individual segments of a primary electron beam deflector.

ii. Extended operation range of the beam deflector to provide a large range of deflection sensitivity based on the desired FOV and the landing energy of primary electron beam.

iii. Adjustable position of the deflection center based on the segment and the number of segments activated to deflect the primary electron beam.

Figure 7D:
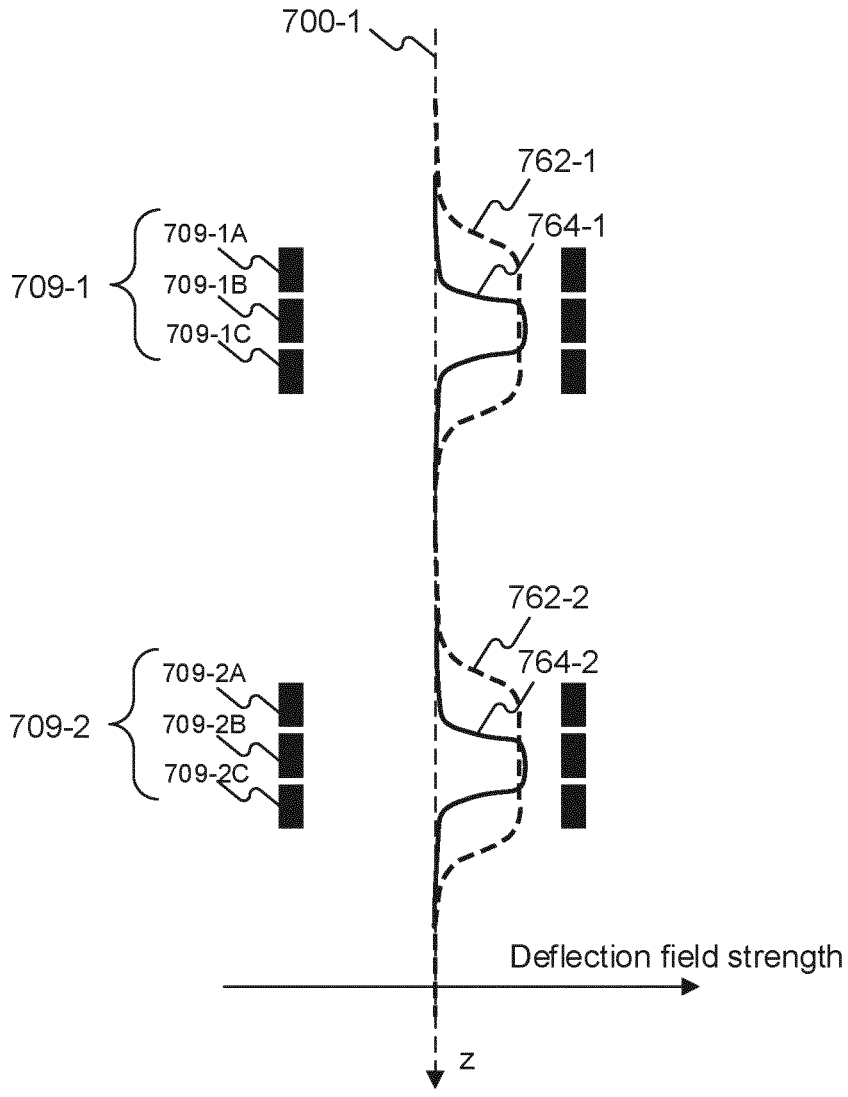
FIG. 7D is a schematic diagram illustrating an exemplary deflection field distribution of the charged-particle beam deflectors, consistent with embodiments of the present disclosure.

Reference is now made to FIG. 7D, which illustrates an exemplary deflection field distribution of the primary electron beam deflectors 709-1 and 709-2, consistent with embodiments of the present disclosure.

In some embodiments, primary electron beam deflectors 709-1 and 709-2 may comprise electrostatic deflectors, and deflection voltages applied to electrodes (e.g., 709-1e-709-8e of FIG. 7B) of a segment may generate an electrostatic deflection field experienced by primary electron beam 700B1 traveling along primary optical axis 700-1. As shown in FIG. 7D, deflection field distribution patterns 762-1, 762-2, 764-1, and 764-2 represent exemplary distribution of deflection fields experienced by primary electron beam 700B1 traveling downstream from the electron source to the sample (e.g., sample 715 of FIG. 7A). In some embodiments, a desired deflection sensitivity of a primary electron beam deflector may be based on a landing energy of the primary electron beam, or a desired field-of-view (FOV). In the context of this disclosure, "deflection sensitivity" may refer to the displacement or deflection of primary electron beam from its original path, per unit of change in the deflection field causing the deflection. As used herein, landing energy of the electron beams may be defined as the energy of the electrons of the primary electron beams as they impact the sample. The landing energy of the primary electron beam is equal to the potential difference between the electron emission source and the stage/sample. For example, if the source is operated at −10 kV and the sample is applied −5 kV, the landing energy of primary electrons may be 5 keV. Typically, in a SEM, the landing energy may range from 0.2 keV to 50 keV, based on the application, material being studied, tool condition, among other factors.

In some embodiments, imaging a sample with low landing energy (0.2 to 10 keV) may be desirable. At low landing energies, the deflection sensitivity of primary electron beam deflectors 709-1 and 709-2 may be high, and therefore, to obtain a certain FOV, the required deflection voltage signals from corresponding driver systems 725-1 and 725-2 may be low. Typically, Digital-to-Analog converters (DAC) such as digital-to-analog converters 734-1 and 734-2 have optimum linearity when the analog output voltage is ~50%-70% of the total voltage output range. If the required deflection voltage signal is lower than the optimum linearity range of digital-to-analog converter 734-1, for example, the induced noise levels may be high, among other things. In such a scenario, scan control unit (e.g., scan control unit 730 of FIG. 7C) may generate and supply a control signal (e.g., control signal 752-1a of FIG. 7C) only to activate an enabled state of distributed output stage 752-1 so that only segment 709-1B may receive the deflection signal (e.g., deflection signal 732-1 of FIG. 7C), thereby creating a deflection field distribution pattern 764-1. The reduced deflection sensitivity due to the reduction in effective deflector length may cause an increase in the required deflection voltage signal, which may bring digital-to-analog converter 734-1 and driver system 725-1 back to the optimum linearity performance regime. The electrons of incoming primary electron beam (e.g., primary electron beam 700B1 of FIG. 7A) may experience a deflection from the original trajectory based on the distribution and intensity of the deflection field. Segment 709-1B of primary electron beam deflector 709-1 may deflect primary electron beam based on the deflection voltage signal between two or more electrodes. Scan control unit 730 may generate and supply a control signal 752-2a to activate an enabled state of distributed output stage 752-2 so that segment 709-2B may receive the deflection signal to deflect primary electron beam, thereby creating a deflection field distribution pattern 764-2. Scan control unit 730 may be further configured to supply control signals to activate disabled states of distributed output stages 751-1, 753-1, 751-2, and 753-2, grounding the disabled distributed output stages.

In some embodiments, imaging a sample with high landing energy (>10 keV) may be desirable. At high landing energies, the deflection sensitivity of primary electron beam deflectors 709-1 and 709-2 may be lower, and therefore, to obtain a certain FOV, the required deflection voltage signals from the corresponding driver systems 725-1 and 725-2 may be higher. The variable gain amplifiers such as variable gain amplifier 740-1 and 740-2 themselves may not be able to supply enough signal gains that the deflectors may require. In such a scenario, scan control unit 730 may generate and supply control signals 751-1a, 752-1a, and 753-1a to activate an enabled state of all the corresponding distributed output stages 751-1, 752-1, and 753-1, respectively, so that all segments 709-1A, 709-1B, and 709-1C may receive deflection signal 732-1, thereby creating a deflection field distribution pattern 762-1, which is broader in comparison with deflection field distribution pattern 764-1. The broad deflection field distribution may result in an increase in the effective length of primary electron beam deflector 709-1, resulting in an enhanced deflection sensitivity. The effective length of the deflectors may be increased to meet the deflection sensitivity requirement to obtain a large FOV. Scan control unit 730 may further generate and supply control signals 751-2a, 752-2a, and 753-2a to activate an enabled state of all corresponding distributed output stages 751-2, 752-2, and 753-2, respectively, so that all segments 709-2A, 709-2B, and 709-2C may receive deflection signal 732-2, thereby creating a deflection field distribution pattern 762-2, which is broader in comparison with deflection field distribution pattern 764-2. In this configuration, deflection field distribution patterns 762-1 and 762-2 are broader along primary optical axis 700-1 in comparison to deflection field distribution patterns 764-1 and 764-2, resulting in higher deflection sensitivity. Although FIG. 7D illustrates uniform deflection field distribution between primary electron beam deflectors 709-1 and 709-2, it is to be appreciated that deflection field distribution may be non-uniform as well. Additionally, or alternatively, the deflector design including number of electrodes, number of segments, inner radii of segments, electrode material; or voltage gain of the amplifiers, among other factors may be adjusted to adjust the deflection sensitivity and FOVs at desired landing energy ranges.

Figure 7E:
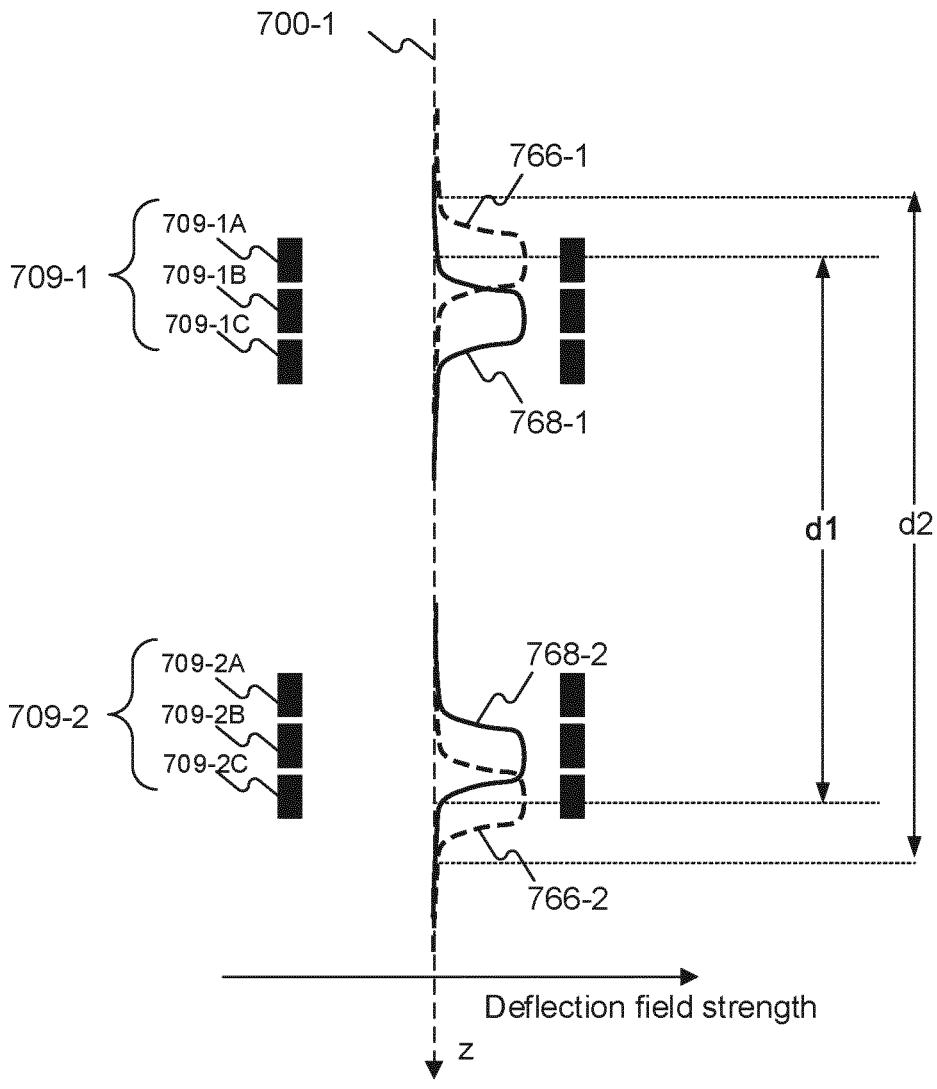
FIG. 7E is a schematic diagram illustrating another exemplary deflection field distribution of the charged-particle beam deflectors, consistent with embodiments of the present disclosure.

Reference is now made to FIG. 7E, which illustrates an exemplary deflection field distribution of the primary electron beam deflectors 709-1 and 709-2, consistent with embodiments of the present disclosure. In some embodiments, it may be desirable to reduce off-axis aberrations at large FOVs to maintain high image quality. In such a scenario, scan control unit 730 may be configured to supply control signals to activate enabled states of distributed output stages 751-1 and 753-2 so that segments 709-1A and 709-2C may receive the deflection signal and deflect primary electron beam based on the generated deflection field distribution patterns 766-1 and 766-2. By doing so, the effective deflection length d2 or deflection sensitivity may be increased. In some embodiments, scan control unit 730 may be configured to supply control signals to activate enabled states of distributed output stages 752-1 and 752-2 so that segments 709-1B and 709-2B may receive the deflection signal and deflect primary electron beam based on the generated deflection field distribution patterns 768-1 and 768-2. In such a configuration, the effective deflection length d1 may be smaller than d2 and the overall deflection sensitivity may be lower. It is to be appreciated that these are exemplary configurations and other combinations of activation of different segments of different beam deflectors may be used as well to adjust deflection sensitivity over a large range of landing energies and FOVs, as appropriate.

Figure 8A:
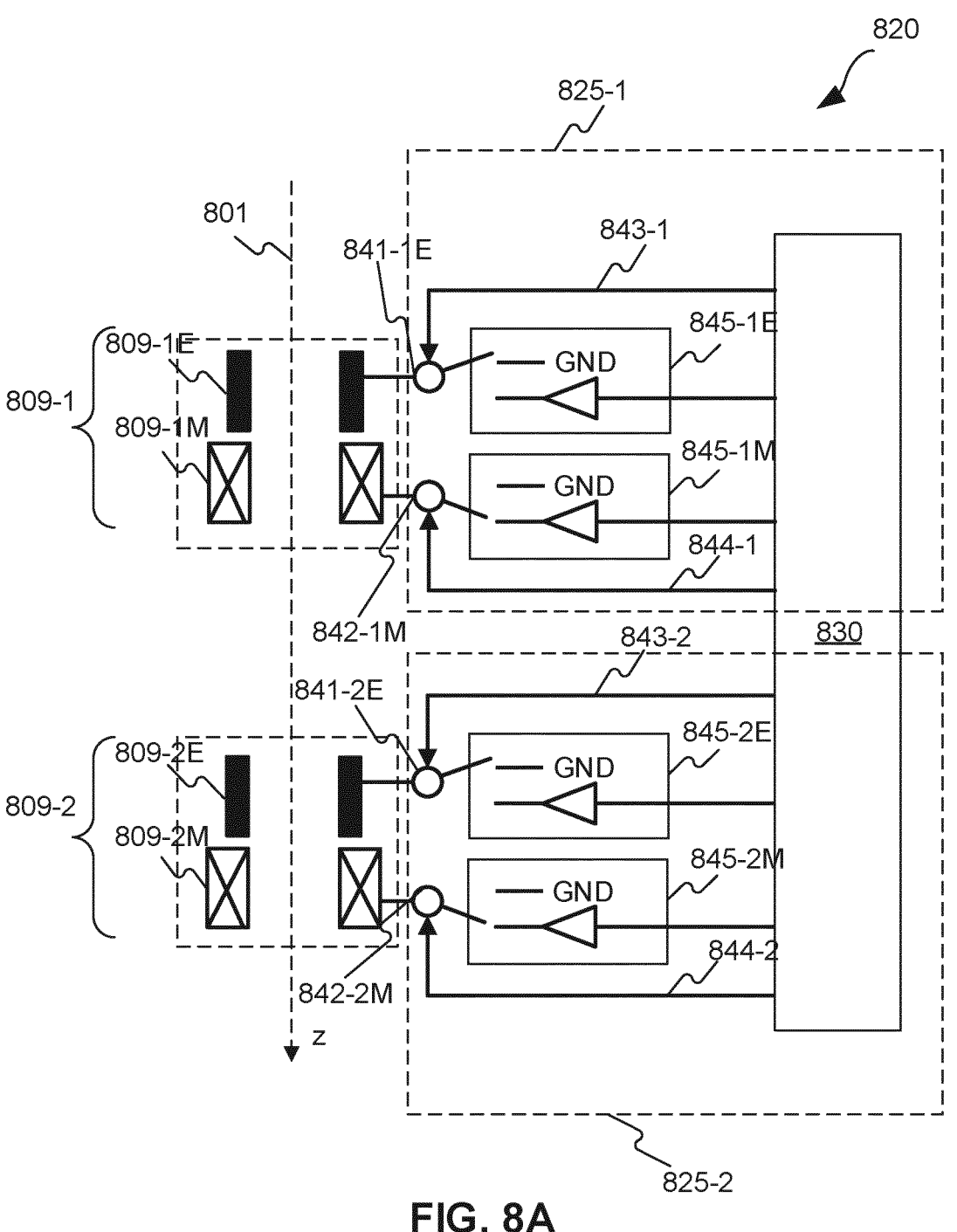
FIGS. 8A-8C are schematic diagrams illustrating exemplary configurations of control circuitry associated with hybrid charged-particle beam deflectors, consistent with embodiments of the present disclosure.

Reference is now made to FIG. 8A, which illustrates an exemplary configuration of deflection control unit 820 associated with charged-particle beam deflectors (e.g., primary electron beam deflectors 809-1 and 809-2), consistent with embodiments of the present disclosure. Primary electron beam deflectors 809-1 and 809-2 may each comprise a hybrid deflector including an electrostatic deflector (e.g., 809-1E, 809-2E) and a magnetic deflector (e.g., 809-1M, 809-2M). As illustrated, each primary electron beam deflector may be electronically driven by a corresponding driver system. As an example, deflection control unit 820 may comprise a driver system 825-1 associated with primary electron beam deflector 809-1, and a driver system 825-2 associated with primary electron beam deflector 809-2. Driver system 825-1 may comprise a scan control unit 830, driver control units 845-1E and 845-1M, and relays 841-1E and 842-1M controlled by control signals 843-1 and 844-1, respectively, generated by scan control unit 830. Driver system 825-2 may comprise scan control unit 830, driver control units 845-2E and 845-2M, and relays 841-2E and 842-2M controlled by control signals 843-2 and 844-2, respectively, generated by scan control unit 830. It is to be appreciated that although not illustrated, driver systems 825-1 and 825-2 may include other components and circuitry such as power supplies, timing circuits, etc. as appropriately needed to manipulate primary electron beam traveling along primary optical axis 800-1. It is to be appreciated that relays (e.g., relay 841-1E, 841-2E, 842-1M, and 842-2M) are mere examples of the functional requirement for switching between a signal and ground state to activate or deactivate the deflector, respectively. Other suitable electrical switching mechanisms such as, but not limited to, electrical switches, distributed output gates, may be used as well.

Hybrid deflectors such as primary electron beam deflectors 809-1 and 809-2 comprising an electrostatic deflector and a magnetic deflector may be useful in obtaining large FOVs over a wide range of landing energy. This is because the deflection sensitivity of an electrostatic deflector (e.g., 809-1E) may be higher than the deflection sensitivity of a magnetic deflector at low landing energies, and the deflection sensitivity of a magnetic deflector (e.g., 809-1M) may be higher than the deflection sensitivity of an electrostatic deflector at high landing energies. In addition to higher deflection sensitivity of magnetic deflectors at high landing energy, the scanning speed of magnetic deflectors is slow. At high landing energy, the signal electrons may mainly comprise backscattered electrons (BSE) originating from deeper layers of the sample. Because of the low BSE yield, the required sampling rate may not be very high, which may allow magnetic deflectors to be suitably used at high landing energies.

At low landing energy, scan control unit 830 may generate control signal 843-1 configured to activate relay 841-1E to enable driver control unit 845-1E. Scan control unit 830 may further be configured to supply a deflection signal to driver control unit 845-1E to be applied to electrostatic deflector 809-1E of primary electron beam deflector 809-1. At high landing energy, however, scan control unit 830 may generate control signal 844-1 configured to activate relay 842-1M to enable driver control unit 845-1M. Scan control unit 830 may further be configured to supply a deflection signal to driver control 845-1M to be applied to magnetic deflector 809-1M. Therefore, the electrostatic and magnetic deflectors of hybrid primary electron beam deflector 809-1 may be configured to deflect primary electron beam to obtain large FOVs at a large range of landing energy, while maintaining high image quality.

As shown in FIG. 8A, electrostatic deflectors 809-1E and 809-2E are located upstream relative to the corresponding magnetic deflectors 809-1M and 809-2M. In some embodiments, electrostatic deflectors 809-1E and 809-2E and magnetic deflectors 809-1M and 809-2M may be disposed coaxially along primary optical axis 800-1. The inner radius and length of electrostatic deflectors 809-1E and 809-2E and magnetic deflectors 809-1M and 809-2M may be substantially similar or different. In some embodiments, electrostatic deflectors 809-1E and 809-2E may comprise segmented deflectors. In some embodiments, electrostatic deflectors 809-1E and 809-2E may be located downstream relative to the corresponding magnetic deflectors 809-1M and 809-2M, or any combination of relative locations may be possible.

Figure 8B:
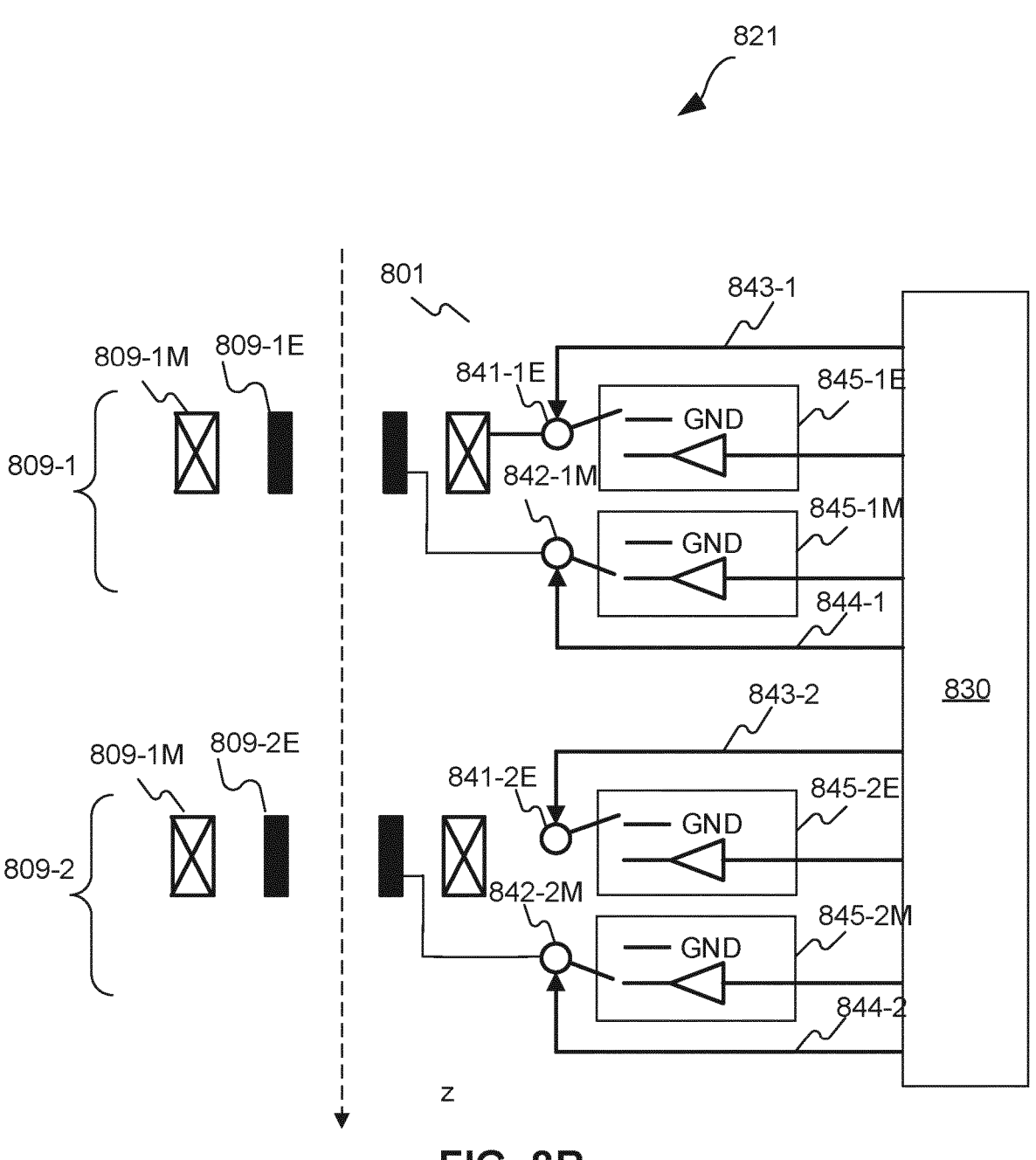

Reference is now made to FIG. 8B, which illustrates an exemplary configuration of deflection control unit 821, consistent with embodiments of the present disclosure. In comparison to deflection control unit 820 of FIG. 8A, in primary electron beam deflector 809-1, electrostatic deflector 809-1E may be located substantially coplanar with magnetic deflector 809-1M and in primary electron beam deflector 809-2, electrostatic deflector 809-2E may be located substantially coplanar with magnetic deflector 809-2M, such that the electrostatic fields and magnetic fields substantially overlap. In such a configuration, the radius of magnetic deflectors 809-1M and 809-2M may be larger than the corresponding electrostatic deflectors 809-1E and 809-2E. Such a configuration of coplanar arrangement of electrostatic and magnetic deflectors may be desirable in reducing the overall length of the electron optics column, or in compact design options for the electron optics column of a charged-particle beam apparatus.

Figure 8C:
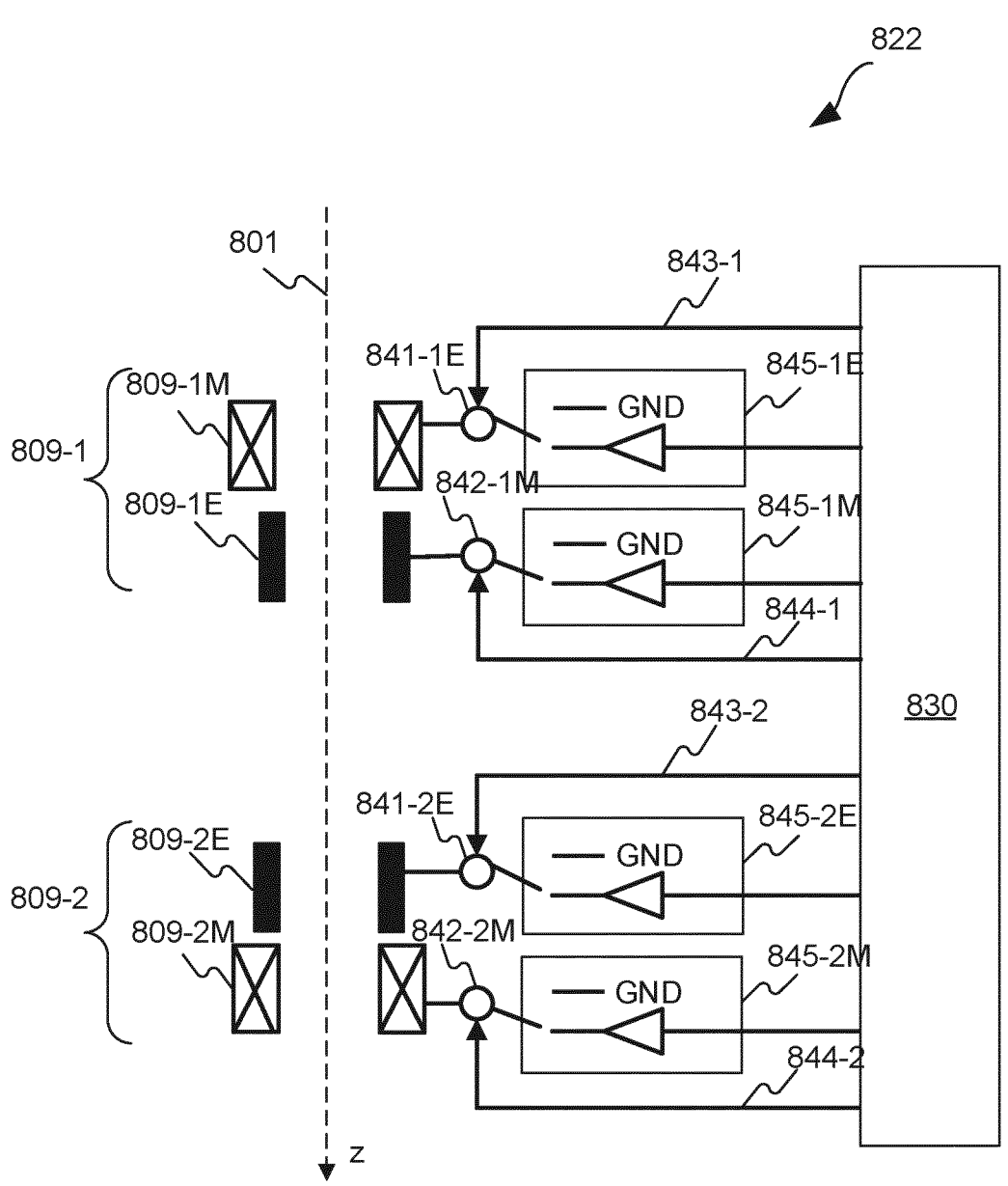

Reference is now made to FIG. 8C, which illustrates an exemplary configuration of deflection control unit 822, consistent with embodiments of the present disclosure. Electrostatic deflector 809-1E may be located downstream of magnetic deflector 809-1M, while electrostatic deflector 809-2E may be located upstream from magnetic deflector 809-2M Similar to deflection control units 820 and 821, electrostatic and magnetic deflectors may be activated at different landing energies when they work separately. However, in a scenario where the electrostatic and magnetic deflectors work in unison, electrostatic deflectors 809-1E and 809-2E may provide faster scanning speed over small FOV, and magnetic deflectors 809-1M and 809-2M may provide a static excitation to point the FOV scanned by electrostatic deflectors to different locations within a larger FOV. In some embodiments, magnetic deflectors 809-1M and 809-2M may have smaller scanning bandwidth to reduce the noise levels and provide a slow scan deflection signal. Such a configuration may reduce the required voltages for electrostatic deflectors because the required FOV may be smaller. This may be beneficial when the landing energy of primary electron beam is high.

In some embodiments, the electrostatic deflector, or the magnetic deflector, or both may be activated based on the landing energy and a desired FOV. For example, in low landing energy mode, only the electrostatic deflectors (e.g., 809-1E or 809-2E) may be activated, in mid-landing energy mode, only the magnetic deflectors (e.g., 809-1M or 809-2M) may be activated, and in high landing energy mode, both electrostatic and magnetic deflectors may be activated simultaneously. In a case where both electrostatic and magnetic deflectors are activated simultaneously, the effective deflection length may be longer along primary optical axis 800-1 when magnetic deflectors 809-1M and 809-2M are located downstream from the corresponding electrostatic deflectors 809-1E and 809-2E. Further, in a case where both electrostatic and magnetic deflectors are activated simultaneously, the deflection field strength is stronger when electrostatic deflectors 809-1E and 809-2E are coplanar with the corresponding magnetic deflectors 809-1M and 809-2M.

Figure 8D:
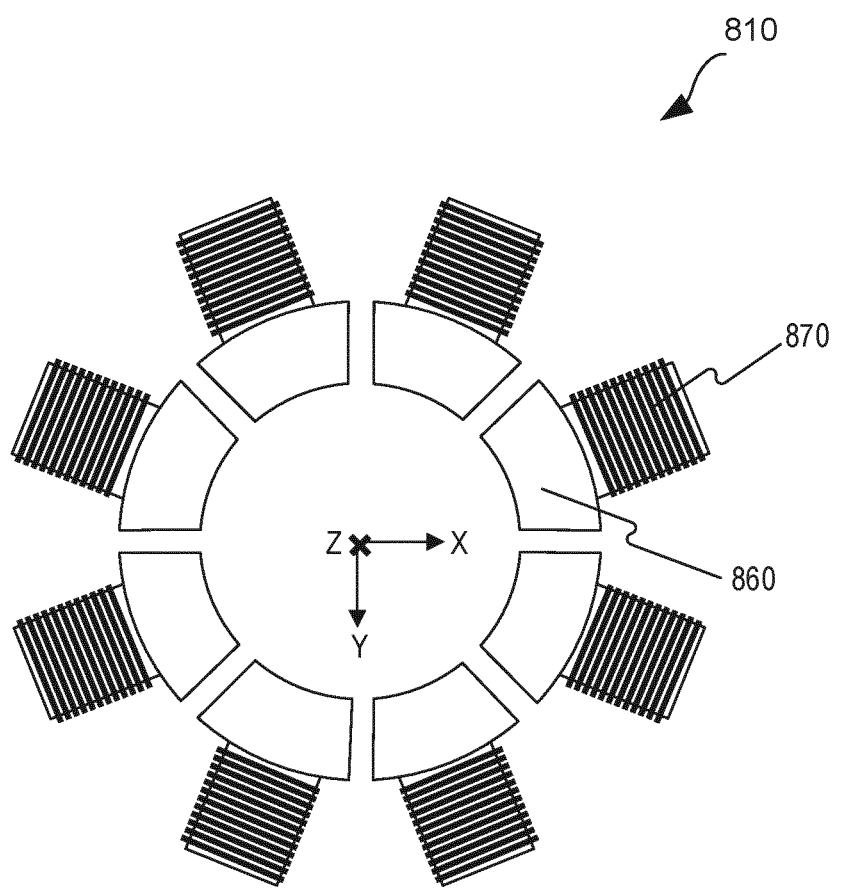
FIG. 8D is a schematic illustration of an exemplary configuration of a hybrid beam deflector, consistent with embodiments of the present disclosure.

Reference is now made to FIG. 8D, which illustrates an exemplary configuration of a hybrid deflector 810, consistent with embodiments of the present disclosure. Hybrid deflector 810 may comprise electrostatic deflector formed by electrostatic electrodes 860 and magnetic deflector by formed by winding coils 870 on a protrusion of electrostatic electrode 860. In some embodiments, the protrusion may be formed on an outer surface of electrostatic electrode 860, directed away from primary optical axis 800-1 (represented as z-axis extending in and out of the paper) such that electrostatic electrode 860 may also act as a pole-piece for magnetic deflector.

Figure 9A:
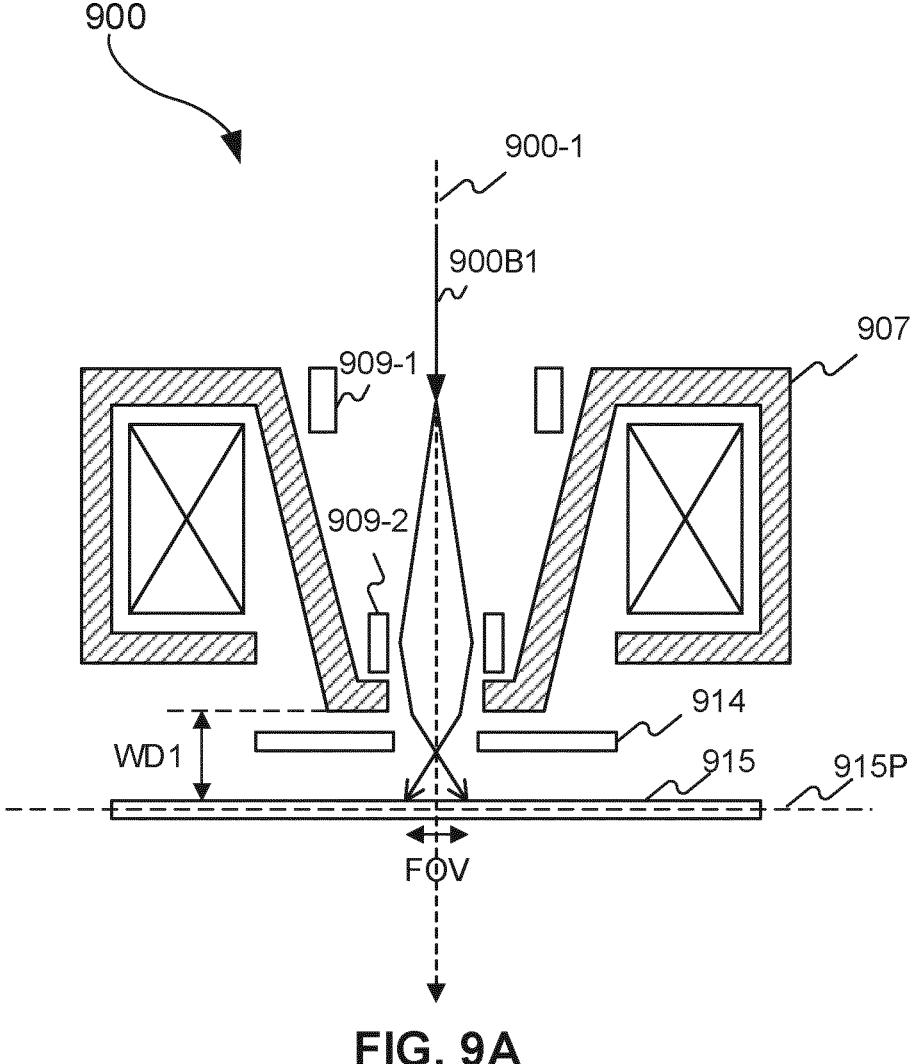
FIGS. 9A-9B are schematic diagrams illustrating exemplary configurations of a charged-particle beam apparatus comprising an adjustable sample stage, consistent with embodiments of the present disclosure.
Figure 9B:
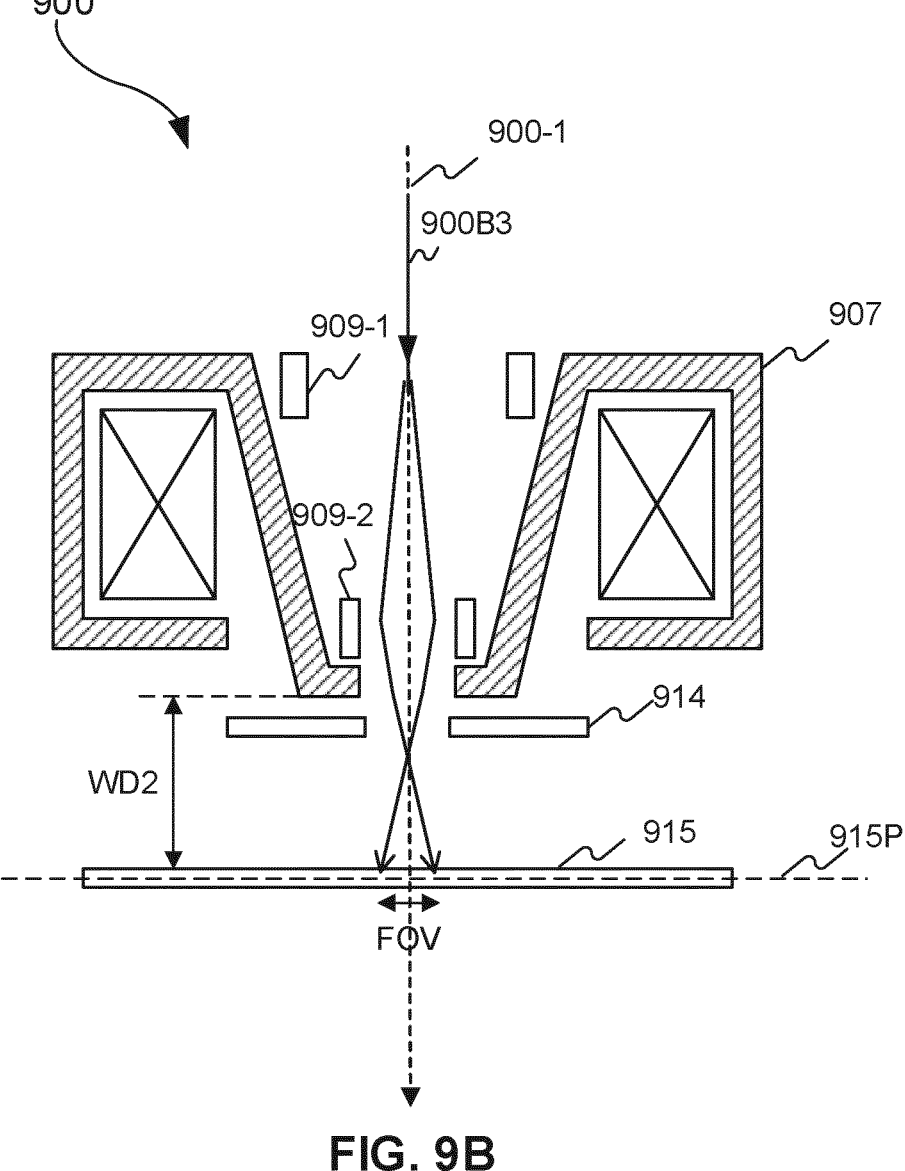

Reference is now made to FIGS. 9A and 9B, which are schematic diagrams illustrating exemplary configurations of a charged-particle beam apparatus 900 comprising an adjustable sample stage, consistent with embodiments of the present disclosure. Charged-particle beam apparatus 900, also referred to as apparatus 900, may comprise an electron beam apparatus. Apparatus 900 may comprise a low landing energy primary electron beam 900B1 or high landing energy primary electron beam 900B3 traveling along a primary optical axis 900-1 towards a sample 915, primary electron beam deflectors 909-1 and 909-2, an objective lens assembly 907, and a control electrode 914. In comparison to apparatus 700, position of sample 915 of apparatus 900 may be adjustable along primary optical axis 900-1. The position of sample 915 may be adjusted relative to other components including, control electrode 914, objective lens 907, among other things, along primary optical axis 900-1. Sample 915 may be disposed on a plane 915P substantially perpendicular to primary optical axis 900-1.

FIG. 9A illustrates a first position of plane 915P along which sample 915 is disposed, defining a distance WD1 between sample 915 and polepiece of objective lens 907. Also illustrated is exemplary deflection path of low landing energy primary electron beam 900B1 on sample 915. In some embodiments, the position of plane 915P along which sample 915 is disposed may be adjusted dynamically, for example, based on a feedback associated with detection efficiency, detection distribution, imaging resolution, desired analysis, among other things. In some embodiments, sample 915 may be disposed on a sample stage (not shown) or on a sample holder (not shown). In such a configuration, the position of the sample stage or the sample holder may be adjusted so that the position of sample 915 may be adjusted. Although not shown, it is appreciated that the position of sample 915 or the sample stage/holder may be adjusted using electromechanical means including, but are not limited to, piezoelectric motor, actuators, micromanipulators, etc. Other micro-movement mechanisms including, but not limited to, mechanical, electromechanical, may be used as well.

One of several ways to maintain the large FOV over a large range of landing energies may include increasing the working distance WD1 between sample 915 and polepiece of objective lens 907. The working distance may be adjusted by, for example, lowering the sample 915 or lowering the stage holding the sample. The low landing energy primary electron beam 900B1 may be focused on a surface of sample 915 by objective lens 907 and deflectors 909-1 and 909-2 may scan beam 900B1 on sample 915 to form a FOV. It is to be appreciated that as shown in FIG. 9A, low landing energy primary electron beam 900B1 may be deflected by a larger distance away from primary optical axis 900-1 due to the higher deflection sensitivity of electrostatic primary electron beam deflector 909-1.

FIG. 9B illustrates a second position of the plane 915P along which sample 915 is disposed, defining a second working distance WD2 between sample 915 and polepiece of objective lens 907. The second working distance WD2 may be larger than the first working distance WD1 such that sample 915 is farther away from polepiece of objective lens 907 along primary optical axis 900-1. As shown in FIG. 9B, high landing energy primary electron beam 900B3 may be deflected by a smaller distance in comparison to low landing energy primary electron beam 900B1 because the deflection sensitivity of electrostatic deflectors 909-1 and 909-2 may be lower. The increase in vertical distance between sample 915 may allow high landing energy primary electron beam 900B3 to travel a longer distance before being incident on sample 915 such that a larger FOV may be obtained. In some embodiments, lowering the position of plane 915P along which sample 915 is disposed may increase the objective lens focal length and reduce the required magnetic lens excitation to focus primary electron beam 900B3 on sample 915 to avoid magnetic saturation on the objective lens polepiece.

Figure 10:
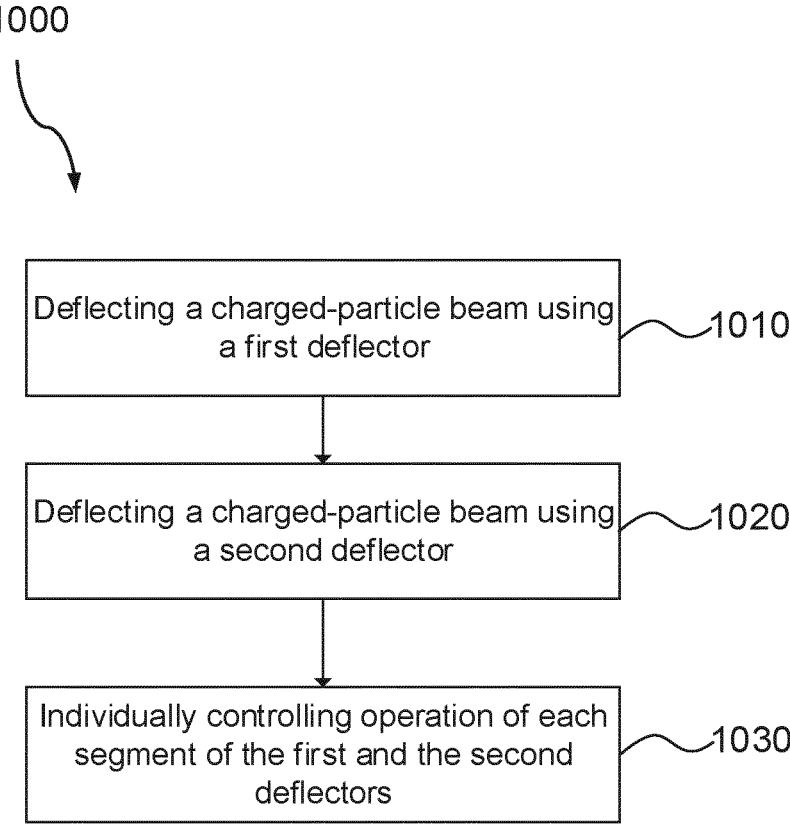
FIG. 10 is a process flowchart illustrating an exemplary method for deflecting a charged-particle beam passing through a deflection scanning unit of a charged-particle beam apparatus, consistent with embodiments of the present disclosure.

Reference is now made to FIG. 10, which is a process flowchart representing an exemplary method 1000 for deflecting a primary charged-particle beam passing through a deflection scanning unit of a charged-particle beam apparatus (e.g., apparatus 700), consistent with embodiments of the present disclosure. The steps of method 1000 may be performed by apparatus 700 of FIG. 7A, for example, executing on or otherwise using the features of a computing device, e.g., controller 50 of FIG. 1 for purposes of illustration. It is appreciated that the illustrated method 1000 can be altered to modify the order of steps and to include additional steps.

In step 1010, a first charged-particle beam deflector (e.g., primary electron beam deflector 709-1 of FIG. 7A) may deflect a primary electron beam (e.g., primary electron beam 700B1 of FIG. 7A). The primary electron beam deflector may comprise an electrostatic, a magnetic, or a hybrid deflector including electrostatic and magnetic deflectors. The first electrostatic deflector may comprise a segmented deflector with a multi-pole structure having two or more electrodes.

In step 1020, a second primary electron beam deflector (e.g., primary electron beam deflector 709-2 of FIG. 7A) may deflect the primary electron beam. The second primary electron beam deflector may comprise an electrostatic, a magnetic, or a hybrid deflector including electrostatic and magnetic deflectors. The second primary electron beam deflector may be located downstream from the first primary electron beam deflector. The second electrostatic deflector may comprise a segmented deflector having multiple segments (e.g., segments 709-1A, 709-1B, and 709-1C of FIG. 7B) disposed coaxially along primary optical axis 700-1, each segment comprising a multi-pole structure having two or more electrodes.

In step 1030, a controller (e.g., deflection control unit 720 of FIG. 7A or FIG. 7C) having circuitry may individually control operation of each segment of the plurality of segments of the first and the second primary electron beam deflectors. The controller may comprise a driver system (e.g., first driver system 725-1 of FIG. 7C) associated with the first primary electron beam deflector, and a second driver system (e.g., second driver system 725-2 of FIG. 7C) associated with the second primary electron beam deflector. The first or the second driver system may comprise a scan control unit (e.g., scan control unit 730 of FIG. 7C) config- ured to generate and supply control signals (e.g., 751-1*a*, 752-1*a*, and 753-1*a* of FIG. 7C). The control signals may activate an enable or a disable state of the corresponding distributed output stage. The scan control unit may be further configured to generate a deflection signal (e.g., deflection signal 732-1 of FIG. 7C) configured to be applied to one or more segments of primary electron beam deflector.

The driver system may further comprise circuitry to convert digital deflection signals to analog deflection sig- nals. The driver system may further comprise circuitry configured to receive the analog deflection signal from a DAC (Digital-to-Analog Converter) and generate a tunable amplitude of the deflection signal. Driver system may fur- ther comprise circuitry configured to be used as switching mechanisms, or distributed output stages implemented as direct-coupled amplifiers, or relays, or other suitable cir- cuitry.

In an exemplary configuration of the deflection control unit, the segments of a primary electron beam deflector may be connected to distributed output stages (e.g., distributed output stages 751-1, 752-1, and 753-1 of FIG. 7C). The enable or disable status of the distributed output stages may be activated by the control signals, supplied by the scan control unit. A variable gain amplifier (e.g., variable gain amplifier 740-1 of FIG. 7C) may be configured to output a tunable amplitude of deflection signal applied to the primary electron beam deflector while maintaining low noise levels. In enable mode, activated by the control signal supplied by the scan control unit, a distributed output stage may repro- duce the output signal from the variable gain amplifier to drive a corresponding segment of the primary electron beam deflector. As an example, control signal 751-1*a* may activate an enable status of distributed output stage 751-1 such that distributed output stage 751-1 may reproduce the adjusted output signal comprising tunable amplitude of deflection signal 732-1 from variable gain amplifier 740-1 to be applied to segment 709-1A of primary electron beam deflec- tor 709-1. The primary electron beam may be deflected based on the deflection signal applied to a segment of primary electron beam deflector.

Figure 11:
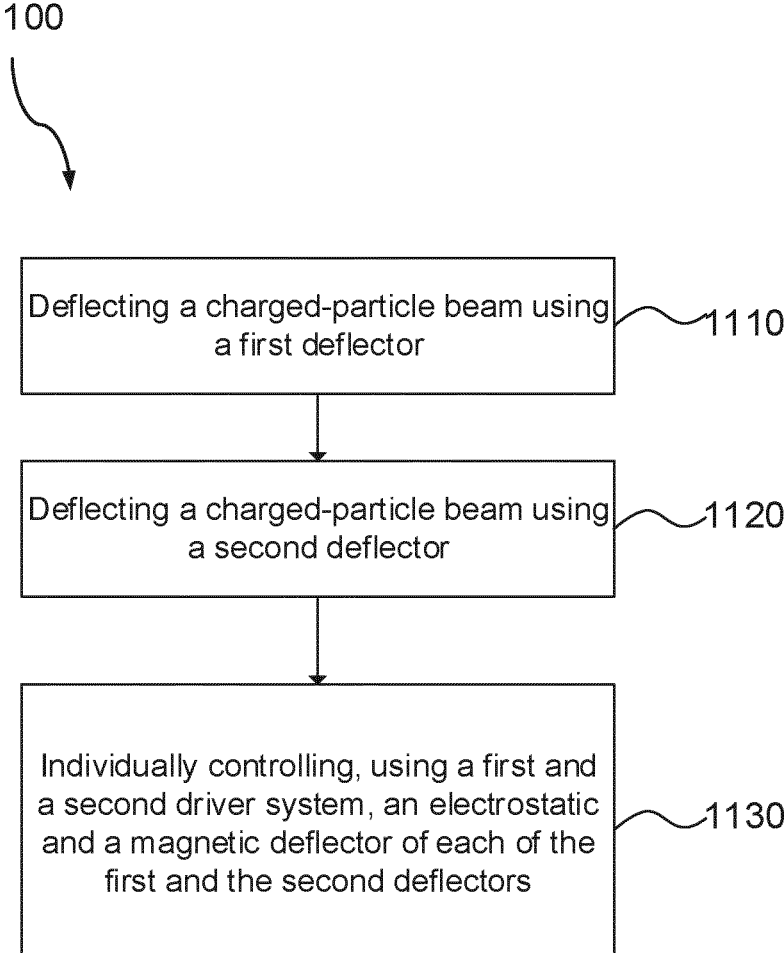
FIG. 11 is a process flowchart illustrating another exemplary method for deflecting a charged-particle beam passing through a deflection scanning unit of a charged-particle beam apparatus, consistent with embodiments of the present disclosure.

Reference is now made to FIG. 11, which is a process flowchart representing an exemplary method 1100 for deflecting a primary charged-particle beam passing through a deflection scanning unit of a charged-particle beam appa- ratus (e.g., apparatus 700), consistent with embodiments of the present disclosure. The steps of method 1100 may be performed by apparatus 700 of FIG. 7A, for example, executing on or otherwise using the features of a computing device, e.g., controller 50 of FIG. 1 for purposes of illus- tration. It is appreciated that the illustrated method 1100 can be altered to modify the order of steps and to include additional steps.

In step 1110, a first charged-particle beam deflector (e.g., primary electron beam deflector 809-1 of FIG. 8A) may deflect a primary electron beam. The primary electron beam deflector may comprise a hybrid deflector including elec- trostatic and magnetic deflectors.

In step 1120, a second primary electron beam deflector (e.g., primary electron beam deflector 809-2 of FIG. 8A) may deflect the primary electron beam. The second primary electron beam deflector may comprise a hybrid deflector including electrostatic and magnetic deflectors. The second primary electron beam deflector may be located downstream from the first primary electron beam deflector. The first and the second hybrid deflectors may be disposed along primary optical axis 800-1.

In step 1130, a first driver system (e.g., driver system 825-1 of FIG. 8A) may be associated with the first primary electron beam deflector (e.g., primary electron beam deflec- tor 809-1), and a driver system (e.g., driver system 825-2 of FIG. 8A) may be associated with the second primary elec- tron beam deflector. The first and the second driver system may individually control the electrostatic and magnetic deflectors of the first and the second primary electron beam deflectors. A driver system may comprise a scan control unit (e.g., scan control unit 830 of FIG. 8A), driver control units (e.g., driver control units 845-1E and 845-1M of FIG. 8A), and relays (e.g., relays 841-1E and 842-1M of FIG. 8A) controlled by control signals (e.g., control signals 843-1 and 844-1), generated by the scan control unit.

Hybrid deflectors such as primary electron beam deflec- tors comprising an electrostatic deflector and a magnetic deflector may be useful in obtaining large FOVs over a wide range of landing energy. This is because the deflection sensitivity of an electrostatic deflector (e.g., 809-1E) may be higher than the deflection sensitivity of a magnetic deflector at low landing energy, and the deflection sensitivity of a magnetic deflector (e.g., 809-1M) may be higher than the deflection sensitivity of an electrostatic deflector at high landing energy.

In some embodiments, a controller may control a charged particle beam system. The controller may include a com- puter processor. The controller may instruct components of the charged particle beam system to perform various func- tions, such as controlling the various drivers for manipulat- ing one or more electron beams. The controller may com- prise a storage that is a storage medium such as a hard disk, cloud storage, random access memory (RAM), other types of computer readable memory, and the like. The controller may communicate with a cloud storage. A non-transitory computer readable medium may be provided that stores instructions for a processor of controller 50 to dynamically deflect an electron beam, or perform other functions and methods consistent with the present disclosure. Common forms of non-transitory media include, for example, a floppy disk, a flexible disk, hard disk, solid state drive, magnetic tape, or any other magnetic data storage medium. In some embodiments, a storage medium may include a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The embodiments may further be described using the following clauses:

1. An apparatus comprising:
   a first charged particle beam manipulator positioned at a first layer and configured to influence a charged particle beam; and
   a second charged particle beam manipulator positioned at a second layer and configured to influence the charged particle beam, wherein the first and second charged particle beam manipulators each comprise:
      a plurality of electrodes having a first set of opposing electrodes and a second set of opposing electrodes;
      a first driver system electrically connected to the first set of opposing electrodes and configured to provide a plurality of first discrete output states to the first set of opposing electrodes; and
      a second driver system electrically connected to the second set of opposing electrodes and configured to provide a plurality of second discrete output states to the second set of opposing electrodes.

2. The apparatus of clause 1, wherein the first driver system is configured to enable the first set of opposing electrodes to deflect the charged particle beam in a first direction.

3. The apparatus of clause 2, wherein the second driver system is configured to enable the second set of opposing electrodes to deflect the charged particle beam in a second direction perpendicular to the first direction.

4. The apparatus of clause 1, wherein the first driver system is configured to provide discrete output states to the first set of opposing electrodes to deflect the charged particle beam in a first direction.

5. The apparatus of clause 4, wherein the second driver system is configured to provide discrete output states to the second set of opposing electrodes to deflect the charged particle beam in a second direction substantially perpendicular to the first direction.

6. The apparatus of clause 1, wherein the first charged particle beam manipulator is configured to deflect the charged particle beam at a first angle and the second charged particle beam manipulator is configured to deflect the charged particle beam at a second angle.

7. The apparatus of any one of clauses 1-6, wherein each of the first driver system and the second driver system comprises switches for providing the plurality of first discrete output states and the plurality of second discrete output states.

8. The apparatus of any one of clauses 1-6, wherein each of the first driver system and the second driver system comprises a plurality of power supplies, each of the plurality of power supplies providing a discrete output state.

9. The apparatus of any one of clauses 1-6, wherein the first driver system comprises a first power supply configured to provide the plurality of first discrete output states, and the second driver system comprises a second power supply configured to provide the plurality of second discrete output states.

10. The apparatus of clause 1, wherein the first charged particle beam manipulator and the second charged particle beam manipulator have equal size.

11. The apparatus of clause 1, wherein the first charged particle beam manipulator has a size N and the second charged particle beam manipulator has a size M, wherein M is an integer multiple of N.

12. The apparatus of clause 11, wherein N defines a length of the first charged particle beam manipulator, and M defines a length of the second charged particle beam manipulator.

13. The apparatus of clause 1, further comprising:
a third charged particle beam manipulator configured to influence the charged particle beam comprising:
a plurality of electrodes;
a driver system electrically connected to the plurality of electrodes and configured to provide continuous output states to the plurality of electrodes.

14. The apparatus of clause 1, wherein the first layer includes multiple charged particle beam manipulators.

15. The apparatus of clause 1, further comprising a controller for generating various control signals to control the first driver system and the second driver system.

16. The apparatus of clause 1, wherein each of the first charged particle beam manipulator and the second charged particle beam manipulator comprise a set of electrodes formed in a substrate.

17. A method for influencing charged particle beam passing through a deflection scanning unit, the method comprising:
providing, by a first driver system, a first set of discrete output states to a first set of opposing electrodes of a first manipulator of the deflection scanning unit; and
providing, by a second driver system, a second set of discrete output states to a second set of opposing electrodes of the first manipulator of the deflection scanning unit.

18. The method of clause 17, further comprising:
providing, by a third driver system, a third set of discrete output states to a third set of opposing electrodes of a second manipulator of the deflection scanning unit; and
providing, by a fourth driver system, a fourth set of discrete output states to a fourth set of opposing electrodes of the second manipulator of the deflection scanning unit,
wherein providing the third and fourth sets of discrete output states enables the second manipulator to influence the charged particle beam passing through the deflection scanning unit.

19. The method of any one of clauses 17 and 18, further comprising:
controlling a linear driver system to influence the charged particle beam, wherein the linear driver system controls the state of a set of electrodes of a third manipulator positioned at a third layer.

20. A non-transitory computer readable medium including a set of instructions that is executable by one or more processors of a controller to cause the controller to perform a method for deflecting a charged particle beam to scan a sample, the method comprising:
instructing a first driver system, connected to a first set of opposing electrodes, to control a first set of discrete output states to cause the first set of opposing electrodes of a first manipulator to influence a charged particle beam; and
instructing a second driver system, connected to a second set of opposing electrodes, to control a second set of discrete output states to cause the second set of opposing electrodes of the first manipulator to influence the charged particle beam,
wherein the first driver system, the first set of opposing electrodes, the second driver system and the second set of opposing electrodes are implemented in a first layer.

21. The computer readable medium of clause 20, wherein the set of instructions that is executable by the one or more processors of the controller to cause the controller to further perform:
instructing a third driver system, connected to a third set of opposing electrodes, to control a third set of discrete output states to cause the third set of opposing electrodes of a second manipulator to influence the charged particle beam; and
instructing a fourth driver system, connected to a fourth set of opposing electrodes, to control a fourth set of discrete output states to cause the fourth set of opposing electrodes of the second manipulator to influence the charged particle beam,
wherein the third driver system, the third set of opposing electrodes, the fourth driver system and the fourth set of opposing electrodes are implemented in a second layer.

22. The computer readable medium of any one of clauses 20 and 21, wherein the set of instructions that is executable by the one or more processors of the controller to cause the controller to further perform:
instructing a linear driver system, connected to a set of electrodes, to control output states to influence the charged particle beam, wherein the linear driver system and the electrodes are implemented in another layer.

23. A deflector structure, comprising:

a plurality of electrode stages, each of the stages including a set of electrodes that are configured to encircle a charged particle beam of a scanning charged particle microscope and to pass the charged particle beam substantially through the center of the set of electrodes of each of the stages, wherein each electrode of the set is configured to be driven by a driver providing a plurality of discrete output states.

24. The deflector structure of clause 23, wherein a first stage of the stages has a size or shape different from that of a second stage of the stages.

25. The deflector structure of clause 23, wherein the plurality of discrete output states includes a first voltage and a second voltage.

26. The deflector structure of clause 23, wherein the deflector structure is formed as a micro-electromechanical system.

27. The apparatus of clause 1, wherein the charged particle beam includes an electron beam.

28. The deflector structure of clause 23, wherein each stage is sized to be a different ratio of a size of a smallest stage of the stages.

29. The deflector structure of clause 23, wherein the driver includes a power supply.

30. The deflector structure of clause 23, wherein the driver includes a plurality of drivers.

31. The apparatus of clause 1, wherein the second layer is below the first layer.

32. The apparatus of clause 1, wherein the plurality of first discrete output states and the plurality of second discrete output states are a same set of discrete output states.

33. The apparatus of clause 6, wherein the first charged particle beam manipulator has a first length so as to deflect the charged particle beam at the first angle, and the second charged particle beam manipulator has a second length so as to deflect the charged particle beam at the second angle.

34. The apparatus of clause 6, wherein a first output is applied to the first charged particle beam manipulator so as to deflect the charged particle beam at the first angle, and a second output is applied to the second charged particle beam manipulator so as to deflect the charged particle beam at the second angle.

35. The apparatus of clause 7, wherein the first driver system comprises a first set of switches configured to provide the plurality of first discrete output states, and the second driver system comprises a second set of switches configured to provide the plurality of second discrete output states.

36. The apparatus of clause 8, wherein the first driver system comprises a first set of power supplies configured to provide the plurality of first discrete output states, and the second driver system comprises a second set of power supplies configured to provide the plurality of second discrete output states.

37. A charged-particle beam apparatus, comprising:

a first charged-particle beam deflector configured to influence a primary charged-particle beam generated by a charged-particle source along a primary optical axis;

a second charged-particle beam deflector positioned downstream from the first charged-particle beam deflector and configured to influence the primary charged-particle beam, wherein the first and the second charged-particle beam deflectors each comprise a plurality of segments; and a controller having circuitry configured to individually control operation of each segment of the plurality of segments.

38. The apparatus of clause 37, wherein a segment of the plurality of segments of the first and the second charged-particle beam deflectors comprises a multi-pole structure configured to deflect the primary charged-particle beam, and wherein the multi-pole structure comprises a dipole, a quadrupole, or an octupole structure.

39. The apparatus of clause 38, wherein the segment comprises a plurality of electrodes radially arranged relative to the primary optical axis.

40. The apparatus of any one of clauses 37-39, wherein the plurality of segments of the first and the second charged-particle beam deflectors are coxially located along the primary optical axis.

41. The apparatus of any one of clauses 37-40, wherein the first and the second charged-particle beam deflectors are located substantially within a cavity of an objective lens and along the primary optical axis.

42. The apparatus of any one of clauses 37-41, wherein the controller includes circuitry further configured to:

generate a first electrical signal configured to control an output stage associated with a segment of the plurality of segments; and generate a second electrical signal configured to be applied to the segment to cause a deflection of the primary charged-particle beam.

43. The apparatus of clause 42, wherein the controller includes circuitry further configured to adjust the second electrical signal based on a desired degree of deflection of the primary charged-particle beam.

44. The apparatus of clause 43, wherein the controller includes circuitry further configured to:

apply the first electrical signal to the output stage associated with the segment of the plurality of segments; and apply the adjusted second electrical signal to the segment based on the first electrical signal, wherein the first electrical signal comprises an activation signal or a deactivation signal configured to enable or disable the output stage, respectively.

45. The apparatus of clause 44, wherein the output stage, enabled in response to the activation signal, is configured to activate the corresponding segment, the activation of the corresponding segment comprising application of the adjusted second electrical signal to cause the primary charged-particle beam to be deflected.

46. The apparatus of clause 44, wherein the output stage, disabled in response to the deactivation signal, is configured to deactivate the corresponding segment such that the primary charged-particle beam passes through substantially undeflected.

47. The apparatus of any one of clauses 42-46, wherein the controller includes circuitry further configured to generate the first electrical signal based on a landing energy of the primary charged-particle beam.

48. The apparatus of any one of clauses 42-47, wherein the controller includes circuitry further configured to generate the first electrical signal based on a desired deflection sensitivity of the first and the second charged-particle beam deflectors.

49. The apparatus of any one of clauses 42-48, wherein the controller includes circuitry further configured to modify a characteristic of the second electrical signal, and wherein modification of the characteristic of the second electrical signal comprises a digital-to-analog signal conversion.

50. The apparatus of any one of clauses 37-49, wherein the primary charged-particle beam comprises an electron beam.

51. The apparatus of any one of clauses 37-50, wherein the first and the second charged-particle beam deflectors comprise an electrostatic deflector.

52. The apparatus of clause 47, wherein a position of a plane of a sample is adjustable along the primary optical axis to adjust a working distance between the sample and a pole-piece based on the landing energy of the primary charged-particle beam and a desired field-of-view.

53. A charged-particle beam apparatus, comprising:
   a first charged-particle beam deflector configured to influence a primary charged-particle beam generated by a charged-particle source along a primary optical axis;
   a second charged-particle beam deflector positioned downstream from the first charged-particle beam deflector and configured to influence the primary charged-particle beam, wherein the first and the second charged-particle beam deflectors each comprise:
      an electrostatic deflector electrically connected to a first driver system configured to enable the electrostatic deflector to deflect the primary charged-particle beam; and
      a magnetic deflector electrically connected to a second driver system configured to enable the magnetic deflector to deflect the primary charged-particle beam.

54. The apparatus of clause 53, wherein the magnetic deflector is located downstream from the electrostatic deflector along the primary optical axis in the first and the second charged-particle beam deflectors.

55. The apparatus of any one of clauses 53 and 54, wherein the first driver system comprises a first relay configured to:
   receive a first electrical signal from a signal source; and
   switch between a ground state and an active state of a first deflection driver unit based on the first electrical signal, wherein
      in the active state, the first deflection driver unit is configured to activate the electrostatic deflector to deflect the primary charged-particle beam based on a second electrical signal, and wherein
      in the ground state, the first deflection driver unit is configured to deactivate the electrostatic deflector.

56. The apparatus of clause 55, wherein the second driver system comprises a second relay configured to:
   receive a third electrical signal from the signal source; and
   switch between a ground state and an active state of a second deflection driver unit based on the third electrical signal, wherein
      in the active state, the second deflection driver unit is configured to activate the magnetic deflector to deflect the primary charged-particle beam based on a fourth electrical signal, and wherein
      in the ground state, the second deflection driver unit is configured to deactivate the magnetic deflector.

57. The apparatus of any one of clauses 53-56, wherein the first and the second deflection driver units are configured to activate the electrostatic deflector or the magnetic deflector, respectively, based on a landing energy of the primary charged-particle beam.

58. The apparatus of clause 53, wherein the electrostatic and the magnetic deflectors are located substantially coplanar relative to the primary optical axis.

59. The apparatus of clause 53, wherein the electrostatic deflector of the first charged-particle beam deflector is located downstream from the magnetic deflector of the first charged-particle beam deflector, and wherein the electro-static deflector of the second charged-particle beam deflector is located upstream from the magnetic deflector of the second charged-particle beam deflector.

60. The apparatus of any one of clause 57-59, wherein a position of a plane of a sample is adjustable along the primary optical axis to adjust a working distance between the sample and a pole-piece based on the landing energy of the primary charged-particle beam and a desired field of view.

61. A method for deflecting a primary charged-particle beam passing through a deflection scanning unit of a charged-particle beam apparatus, the method comprising:
   deflecting, using a first charged-particle beam deflector, the primary charged-particle beam generated by a charged-particle source along a primary optical axis;
   deflecting, using a second charged-particle beam deflector positioned downstream from the first charged-particle beam deflector, the primary charged-particle beam, wherein the first and the second charged-particle beam deflectors each comprise a plurality of segments; and
   individually controlling operation, using a controller having circuitry, of each segment of the plurality of segments.

62. The method of clause 61, further comprising generating, using the controller:
   a first electrical signal configured to control an output stage associated with a segment of the plurality of segments; and
   a second electrical signal configured to enable the segment to deflect the primary charged-particle beam.

63. The method of clause 62, further comprising adjusting, using the controller, the second electrical signal based on a desired degree of deflection of the primary charged-particle beam.

64. The method of clause 63, further comprising applying, using the controller:
   the first electrical signal to the output stage associated with the segment of the plurality of segments; and
   the adjusted second electrical signal to the segment based on the first electrical signal, wherein the first electrical signal comprises an activation signal or a deactivation signal configured to enable or disable the output stage, respectively.

65. The method of clause 64, further comprising enabling, in response to the activation signal, the output stage to activate the corresponding segment to cause the primary charged-particle beam to be deflected.

66. The method of clause 64, further comprising disabling, in response to the deactivation signal, the output stage to deactivate the corresponding segment such that the primary charged-particle beam passes through undeflected.

67. The method of clause any one of clauses 62-66, further comprising generating, using the controller, the first electrical signal based on a landing energy of the primary charged-particle beam 68. The method of clause 67, further comprising adjusting a position of a plane of a sample along the primary optical axis to adjust a working distance between the sample and a pole-piece based on the landing energy of the primary charged-particle beam.

69. The method of any one of clauses 62-68, further comprising generating, using the controller, the first electrical signal based on a desired deflection sensitivity of the first and the second charged-particle beam deflectors.

70. A method for deflecting a primary charged-particle beam passing through a deflection scanning unit of a charged-particle beam apparatus, the method comprising:

deflecting, using a first charged-particle beam deflector, the primary charged-particle beam generated by a charged-particle source along a primary optical axis;

deflecting, using a second charged-particle beam deflector positioned downstream from the first charged-particle beam deflector, the primary charged-particle beam, wherein the first and the second charged-particle beam deflectors each comprise:

an electrostatic deflector electrically connected to a first driver system configured to enable the electrostatic deflector to influence the primary charged-particle beam; and a magnetic deflector electrically connected to a second driver system configured to enable the magnetic deflector to influence the primary charged-particle beam.

71. The method of clause 70, further comprising:

generating a first electrical signal and a second electrical signal from a signal source;

receiving, by a first relay, the first electrical signal; and switching between a ground state and an active state of a first deflection driver unit based on the first electrical signal, wherein in the active state, the first deflection driver unit is configured to activate the electrostatic deflector to deflect the primary charged-particle beam based on the second electrical signal, and wherein in the ground state, the first deflection driver unit is configured to deactivate the electrostatic deflector.

72. The method of clause 71, further comprising:

generating a third electrical signal and a fourth electrical signal from the signal source;

receiving, by a second relay, the third electrical signal; and switching between a ground state and an active state of a second deflection driver unit based on the third electrical signal, wherein in the active state, the second deflection driver unit is configured to activate the magnetic deflector to deflect the primary charged-particle beam based on the fourth electrical signal, and wherein in the ground state, the second deflection driver unit is configured to deactivate the magnetic deflector.

73. The method of any one of clauses 70-72, further comprising activating the electrostatic deflector or the magnetic deflector of the first and the second charged-particle beam deflectors based on a landing energy of the primary charged-particle beam.

74. The method of clause 73, further comprising adjusting a position of a plane of a sample along the primary optical axis to adjust a working distance between a sample and a pole-piece based on the landing energy of the primary charged-particle beam.

75. A non-transitory computer readable medium storing a set of instructions that is executable by one or more processors of a charged-particle beam apparatus to cause the charged-particle beam apparatus to perform a method of deflecting a primary charged-particle beam passing through a deflection scanning unit of the charged-particle beam apparatus, the method comprising:

deflecting, using a first charged-particle beam deflector, the primary charged-particle beam generated by a charged-particle source along a primary optical axis;

deflecting, using a second charged-particle beam deflector positioned downstream from the first charged-particle beam deflector, the primary charged-particle beam, wherein the first and the second charged-particle beam deflectors each comprise a plurality of segments; and individually controlling operation of each segment of the plurality of segments configured to deflect the primary charged-particle beam.

76. A non-transitory computer readable medium storing a set of instructions that is executable by one or more processors of a charged-particle beam apparatus to cause the charged-particle beam apparatus to perform a method of deflecting a primary charged-particle beam passing through a deflection scanning unit of the charged-particle beam apparatus, the method comprising:

deflecting, using a first charged-particle beam deflector, the primary charged-particle beam generated by a charged-particle source along a primary optical axis;

deflecting, using a second charged-particle beam deflector positioned downstream from the first charged-particle beam deflector, the primary charged-particle beam, wherein the first and the second charged-particle beam deflectors each comprise:

an electrostatic deflector electrically connected to a first driver system configured to enable the electrostatic deflector to influence the primary charged-particle beam; and a magnetic deflector electrically connected to a second driver system configured to enable the magnetic deflector to influence the primary charged-particle beam.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

While the embodiments of the present disclosure have been described in connection with various embodiments, it is appreciated that various modifications and changes can be made without departing from the scope thereof. It is intended that the specification and examples be considered as exemplary only.

The invention claimed is:

1. An apparatus comprising:

a first charged particle beam manipulator positioned at a first layer and configured to influence a charged particle beam directed toward a sample; and a second charged particle beam manipulator positioned at a second layer and configured to influence the charged particle beam, wherein the first and second charged particle beam manipulators each comprise:

a plurality of electrodes having a first set of opposing electrodes and a second set of opposing electrodes;

a first driver system electrically connected to the first set of opposing electrodes and configured to provide a plurality of first discrete output states to the first set of opposing electrodes; and a second driver system electrically connected to the second set of opposing electrodes and configured to provide a plurality of second discrete output states to the second set of opposing electrodes, wherein each of the first and the second driver system comprises a power supply and corresponding one or more switches.

2. The apparatus of claim 1, wherein the first driver system is configured to enable the first set of opposing electrodes to deflect the charged particle beam in a first direction.

3. The apparatus of claim 2, wherein the second driver system is configured to enable the second set of opposing electrodes to deflect the charged particle beam in a second direction perpendicular to the first direction.

4. The apparatus of claim 1, wherein the first driver system is configured to provide discrete output states to the first set of opposing electrodes to deflect the charged particle beam in a first direction.

5. The apparatus of claim 4, wherein the second driver system is configured to provide discrete output states to the second set of opposing electrodes to deflect the charged particle beam in a second direction substantially perpendicular to the first direction.

6. The apparatus of claim 1, wherein the first charged particle beam manipulator is configured to deflect the charged particle beam at a first angle and the second charged particle beam manipulator is configured to deflect the charged particle beam at a second angle.

7. The apparatus of claim 1, wherein the power supply is configured to generate a plurality of discrete output states and wherein the corresponding one or more switches are configured to transmit the plurality of discrete output states to a corresponding set of opposing electrodes.

8. The apparatus of claim 1, wherein the power supply comprises a single output driver or a multiple output driver.

9. The apparatus of claim 1, wherein the first driver system comprises a first power supply configured to provide the plurality of first discrete output states, and the second driver system comprises a second power supply configured to provide the plurality of second discrete output states.

10. The apparatus of claim 1, wherein the first charged particle beam manipulator and the second charged particle beam manipulator have equal size.

11. The apparatus of claim 1, wherein the first charged particle beam manipulator has a size N and the second charged particle beam manipulator has a size M, wherein M is an integer multiple of N.

12. The apparatus of claim 11, wherein N defines a length of the first charged particle beam manipulator, and M defines a length of the second charged particle beam manipulator.

13. The apparatus of claim 1, further comprising:
a third charged particle beam manipulator configured to influence the charged particle beam comprising:
a plurality of electrodes;
a driver system electrically connected to the plurality of electrodes and configured to provide continuous output states to the plurality of electrodes.

14. The apparatus of claim 1, wherein the first layer includes multiple charged particle beam manipulators.

15. A method for influencing a charged particle beam passing through a deflection scanning unit, the method comprising:
providing, by a first driver system, a first set of discrete output states to a first set of opposing electrodes of a first charged particle beam manipulator of the deflection scanning unit, the first charged particle beam manipulator positioned at a first layer; and
providing, by a second driver system, a second set of discrete output states to a second set of opposing electrodes of the first charged particle beam manipulator of the deflection scanning unit, wherein each of the first and the second driver system comprises a power supply and corresponding one or more switches, and
wherein providing the first and the second sets of discrete output states enables the first charged particle beam manipulator to influence the charged particle beam directed toward a sample.

16. The method of claim 15, further comprising:
providing, by a third driver system, a third set of discrete output states to a third set of opposing electrodes of a second charged particle beam manipulator of the deflection scanning unit, the second charged particle beam manipulator positioned at a second layer; and
providing, by a fourth driver system, a fourth set of discrete output states to a fourth set of opposing electrodes of the second charged particle beam manipulator of the deflection scanning unit,
wherein providing the third and fourth sets of discrete output states enables the second charged particle beam manipulator to influence the charged particle beam passing through the deflection scanning unit.

17. The method of claim 16, further comprising:
controlling a linear driver system to influence the charged particle beam, wherein the linear driver system controls the state of a set of electrodes of a third charged particle beam manipulator positioned at a third layer, and wherein the linear driver system comprises a linear amplifier.

18. A non-transitory computer readable medium including a set of instructions that is executable by one or more processors of a controller to cause the controller to perform a method for deflecting a charged particle beam to scan a sample, the method comprising:
instructing a first driver system, connected to a first set of opposing electrodes, to control a first set of discrete output states to cause the first set of opposing electrodes of a first charged particle beam manipulator to influence a charged particle beam directed toward a sample; and
instructing a second driver system, connected to a second set of opposing electrodes, to control a second set of discrete output states to cause the second set of opposing electrodes of the first charged particle beam manipulator to influence the charged particle beam,
wherein the first driver system, the first set of opposing electrodes, the second driver system and the second set of opposing electrodes are implemented in a first layer, and
wherein each of the first and the second driver system comprises a power supply and corresponding one or more switches.

19. The computer readable medium of claim 18, wherein the set of instructions that is executable by the one or more processors of the controller to cause the controller to further perform:
instructing a third driver system, connected to a third set of opposing electrodes, to control a third set of discrete output states to cause the third set of opposing electrodes of a second charged particle beam manipulator to influence the charged particle beam; and
instructing a fourth driver system, connected to a fourth set of opposing electrodes, to control a fourth set of discrete output states to cause the fourth set of opposing electrodes of the second charged particle beam manipulator to influence the charged particle beam, wherein the third driver system, the third set of opposing electrodes, the fourth driver system and the fourth set of opposing electrodes are implemented in a second layer.

20. The computer readable medium of claim 18, wherein the set of instructions that is executable by the one or more processors of the controller to cause the controller to further perform:

instructing a linear driver system, connected to a set of electrodes, to control output states to influence the charged particle beam, wherein the linear driver system and the electrodes are implemented in another layer.

\* \* \* \* \*